(12) United States Patent
Kothari et al.

(10) Patent No.: US 8,193,441 B2
(45) Date of Patent: Jun. 5, 2012

(54) PHOTOVOLTAICS WITH INTERFEROMETRIC RIBBON MASKS

(75) Inventors: Manish Kothari, Cupertino, CA (US); Kasra Khazeni, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 839 days.

(21) Appl. No.: 12/336,865

(22) Filed: Dec. 17, 2008

(65) Prior Publication Data

US 2009/0151771 A1   Jun. 18, 2009

Related U.S. Application Data

(60) Provisional application No. 61/014,405, filed on Dec. 17, 2007.

(51) Int. Cl.
*H01L 31/05* (2006.01)
*H01L 31/00* (2006.01)
*B05D 5/12* (2006.01)

(52) U.S. Cl. ........ 136/244; 359/380; 359/389; 136/256; 156/247; 427/74

(58) Field of Classification Search .............. 359/380, 359/389

See application file for complete search history.

(56) References Cited

U.S. PATENT DOCUMENTS

| 2,677,714 | A | 5/1954 | Auwarter |
|---|---|---|---|
| 3,247,392 | A | 4/1966 | Thelan |
| 3,679,313 | A | 7/1972 | Rosenberg |
| 4,116,718 | A | 9/1978 | Yerkes et al. |
| 4,200,472 | A | 4/1980 | Chappell et al. |
| 4,282,862 | A | 8/1981 | Soleau |
| 4,306,716 | A | 12/1981 | James et al. |
| 4,357,486 | A | 11/1982 | Blieden et al. |
| 4,377,324 | A | 3/1983 | Durand et al. |
| 4,389,096 | A | 6/1983 | Hori et al. |
| 4,400,577 | A | 8/1983 | Spear |
| 4,441,789 | A | 4/1984 | Pohlack |
| 4,497,974 | A | 2/1985 | Deckman et al. |
| 4,633,031 | A | 12/1986 | Todorof |
| 4,688,068 | A | 8/1987 | Chaffin et al. |
| 4,705,361 | A | 11/1987 | Frazier et al. |

(Continued)

FOREIGN PATENT DOCUMENTS

CN   1517743   7/2006

(Continued)

OTHER PUBLICATIONS

Chemical Properties Handbook, 1999, Refractive Index, Dipole Moment, and Radius of Gyration; Inorganic Compounds, McGraw-Hill, 1 pp.

(Continued)

*Primary Examiner* — Jennifer Michener
*Assistant Examiner* — Magali P Slawski
(74) *Attorney, Agent, or Firm* — Knobbe Martens Olson & Bear LLP

(57) ABSTRACT

An interferometric mask covering a reflective conductive ribbon that electrically interconnects a plurality of photovoltaic cells is disclosed. Such an interferometric mask may reduce reflections of incident light from the conductors. In various embodiments, the mask reduces reflections, so that a front and back electrode pattern appears black or similar in color to surrounding features of the device. In other embodiments, the mask may modulate reflections of light such that the electrode pattern matches a color in the visible spectrum.

21 Claims, 18 Drawing Sheets

U.S. PATENT DOCUMENTS

| | | |
|---|---|---|
| 4,822,993 A | 4/1989 | Dillon et al. |
| 4,859,060 A | 8/1989 | Katagiri et al. |
| 4,915,479 A | 4/1990 | Clarke |
| 4,947,291 A | 8/1990 | McDermott |
| 4,980,775 A | 12/1990 | Brody |
| 4,982,184 A | 1/1991 | Kirkwood |
| 5,044,736 A | 9/1991 | Jaskie et al. |
| 5,110,370 A | 5/1992 | Vogeli et al. |
| 5,142,414 A | 8/1992 | Koehler |
| 5,261,970 A | 11/1993 | Landis et al. |
| 5,356,488 A | 10/1994 | Hezel |
| 5,361,190 A | 11/1994 | Roberts et al. |
| 5,398,170 A | 3/1995 | Lee |
| 5,401,983 A | 3/1995 | Jokerst et al. |
| 5,500,761 A | 3/1996 | Goossen et al. |
| 5,544,268 A | 8/1996 | Bischel et al. |
| 5,550,373 A | 8/1996 | Cole et al. |
| 5,578,140 A | 11/1996 | Yogev et al. |
| 5,633,739 A | 5/1997 | Matsuyama et al. |
| 5,710,656 A | 1/1998 | Goossen |
| 5,720,827 A | 2/1998 | Simmons |
| 5,726,805 A | 3/1998 | Kaushik et al. |
| 5,745,281 A | 4/1998 | Yi et al. |
| 5,754,260 A | 5/1998 | Ooi et al. |
| 5,782,995 A | 7/1998 | Nanya et al. |
| 5,805,117 A | 9/1998 | Mazurek et al. |
| 5,835,255 A | 11/1998 | Miles |
| 5,853,310 A | 12/1998 | Nishimura et al. |
| 5,868,480 A | 2/1999 | Zeinali |
| 5,886,688 A | 3/1999 | Fifield et al. |
| 5,907,426 A | 5/1999 | Kato et al. |
| 5,914,804 A | 6/1999 | Goossen |
| 5,933,183 A | 8/1999 | Enomoto et al. |
| 5,986,796 A | 11/1999 | Miles |
| 5,991,073 A | 11/1999 | Woodgate et al. |
| 6,008,449 A | 12/1999 | Cole |
| 6,021,007 A | 2/2000 | Murtha |
| 6,023,373 A | 2/2000 | Inoguchi et al. |
| 6,031,653 A | 2/2000 | Wang |
| 6,040,937 A | 3/2000 | Miles |
| 6,055,090 A | 4/2000 | Miles |
| 6,091,195 A | 7/2000 | Forrest et al. |
| 6,094,285 A | 7/2000 | Wickham et al. |
| 6,123,431 A | 9/2000 | Teragaki et al. |
| 6,300,558 B1 | 10/2001 | Takamoto et al. |
| 6,323,415 B1 | 11/2001 | Uematsu et al. |
| 6,323,923 B1 | 11/2001 | Hoshino et al. |
| 6,356,378 B1 | 3/2002 | Huibers |
| 6,381,022 B1 | 4/2002 | Zavracky |
| 6,400,738 B1 | 6/2002 | Tucker et al. |
| 6,402,325 B1 | 6/2002 | Yamamoto |
| 6,421,103 B2 | 7/2002 | Yamaguchi |
| 6,442,124 B1 | 8/2002 | Chung et al. |
| 6,480,634 B1 | 11/2002 | Corrigan |
| 6,483,613 B1 | 11/2002 | Woodgate et al. |
| 6,518,944 B1 | 2/2003 | Doane et al. |
| 6,527,410 B2 | 3/2003 | Yamaguchi |
| 6,574,033 B1 | 6/2003 | Chui et al. |
| 6,630,968 B1 | 10/2003 | Tsuchihashi et al. |
| 6,636,322 B1 | 10/2003 | Terashita |
| 6,650,455 B2 | 11/2003 | Miles |
| 6,674,562 B1 | 1/2004 | Miles |
| 6,707,594 B2 | 3/2004 | Holmes |
| 6,741,377 B2 | 5/2004 | Miles |
| 6,760,146 B2 | 7/2004 | Ikeda et al. |
| 6,768,555 B2 | 7/2004 | Chen |
| 6,822,157 B2 | 11/2004 | Fujioka |
| 6,841,787 B2 | 1/2005 | Almogy |
| 6,867,896 B2 | 3/2005 | Miles |
| 6,871,982 B2 | 3/2005 | Holman et al. |
| 6,891,869 B2 | 5/2005 | Augusto |
| 6,912,022 B2 | 6/2005 | Lin et al. |
| 6,930,816 B2 | 8/2005 | Mochizuki |
| 6,967,779 B2 | 11/2005 | Fadel et al. |
| 6,970,155 B2 | 11/2005 | Cabrera |
| 7,002,726 B2 | 2/2006 | Patel et al. |
| 7,009,754 B2 | 3/2006 | Huibers |
| 7,034,981 B2 | 4/2006 | Makigaki |
| 7,072,093 B2 | 7/2006 | Piehl et al. |
| 7,072,096 B2 | 7/2006 | Holman et al. |
| 7,113,339 B2 | 9/2006 | Taguchi et al. |
| 7,123,216 B1 | 10/2006 | Miles |
| 7,126,738 B2 | 10/2006 | Miles |
| 7,138,984 B1 | 11/2006 | Miles |
| 7,142,347 B2 | 11/2006 | Islam |
| 7,161,730 B2 | 1/2007 | Floyd |
| 7,187,489 B2 | 3/2007 | Miles |
| 7,210,806 B2 | 5/2007 | Holman et al. |
| 7,218,429 B2 | 5/2007 | Batchko |
| 7,255,980 B2 * | 8/2007 | Hwang et al. .................. 430/321 |
| 7,304,784 B2 | 12/2007 | Chui et al. |
| 7,327,510 B2 | 2/2008 | Cummings et al. |
| 7,372,449 B2 | 5/2008 | Kodama et al. |
| 7,385,748 B2 | 6/2008 | Miles |
| 7,400,439 B2 | 7/2008 | Holman et al. |
| 7,520,642 B2 | 4/2009 | Holman et al. |
| 7,580,175 B2 | 8/2009 | Aksyuk et al. |
| 7,595,926 B2 | 9/2009 | Sasagawa et al. |
| 7,605,969 B2 | 10/2009 | Miles |
| 7,679,627 B2 | 3/2010 | Sampsell |
| 7,701,029 B2 | 4/2010 | Mabuchi |
| 7,719,500 B2 | 5/2010 | Chui |
| 7,741,144 B2 | 6/2010 | Choi et al. |
| 7,804,023 B2 | 9/2010 | Wong et al. |
| 7,848,003 B2 | 12/2010 | Kothari et al. |
| 7,855,824 B2 | 12/2010 | Gally |
| 7,907,319 B2 | 3/2011 | Miles |
| 2001/0006066 A1 | 7/2001 | Cherney et al. |
| 2001/0055208 A1 | 12/2001 | Kimura |
| 2002/0024711 A1 | 2/2002 | Miles |
| 2002/0054424 A1 | 5/2002 | Miles |
| 2002/0075555 A1 | 6/2002 | Miles |
| 2002/0080465 A1 | 6/2002 | Han et al. |
| 2002/0115215 A1 | 8/2002 | Wolffe et al. |
| 2002/0126364 A1 | 9/2002 | Miles |
| 2003/0002124 A1 | 1/2003 | Green et al. |
| 2003/0006730 A1 | 1/2003 | Tachibana |
| 2003/0043157 A1 | 3/2003 | Miles |
| 2003/0107692 A1 | 6/2003 | Sekiguchi |
| 2003/0161040 A1 | 8/2003 | Ishii et al. |
| 2003/0210363 A1 | 11/2003 | Yasukawa et al. |
| 2003/0213514 A1 | 11/2003 | Ortabasi |
| 2003/0214621 A1 | 11/2003 | Kim et al. |
| 2004/0066477 A1 | 4/2004 | Morimoto et al. |
| 2004/0076802 A1 | 4/2004 | Tompkin et al. |
| 2004/0115339 A1 | 6/2004 | Ito |
| 2004/0125281 A1 | 7/2004 | Lin et al. |
| 2004/0188599 A1 | 9/2004 | Viktorovitch et al. |
| 2004/0200520 A1 | 10/2004 | Mulligan et al. |
| 2004/0259010 A1 | 12/2004 | Kanbe |
| 2005/0046919 A1 | 3/2005 | Taguchi et al. |
| 2005/0117623 A1 | 6/2005 | Shchukin et al. |
| 2005/0179977 A1 | 8/2005 | Chui et al. |
| 2005/0225686 A1 | 10/2005 | Brummack et al. |
| 2006/0022966 A1 | 2/2006 | Mar |
| 2006/0028708 A1 | 2/2006 | Miles |
| 2006/0066541 A1 | 3/2006 | Gally et al. |
| 2006/0066783 A1 | 3/2006 | Sampsell et al. |
| 2006/0066935 A1 | 3/2006 | Cummings et al. |
| 2006/0067600 A1 | 3/2006 | Gally et al. |
| 2006/0067633 A1 | 3/2006 | Gally et al. |
| 2006/0077122 A1 | 4/2006 | Gally et al. |
| 2006/0077521 A1 | 4/2006 | Gally et al. |
| 2006/0103912 A1 | 5/2006 | Katoh et al. |
| 2006/0130889 A1 | 6/2006 | Li et al. |
| 2006/0176487 A1 | 8/2006 | Cummings et al. |
| 2006/0180886 A1 | 8/2006 | Tsang |
| 2006/0201546 A1 | 9/2006 | Yokoyama |
| 2006/0262562 A1 | 11/2006 | Fukasawa et al. |
| 2006/0274243 A1 | 12/2006 | Iijima et al. |
| 2007/0064446 A1 | 3/2007 | Sharma et al. |
| 2007/0077525 A1 | 4/2007 | Davis et al. |
| 2007/0113887 A1 | 5/2007 | Laih et al. |
| 2007/0115415 A1 | 5/2007 | Piehl et al. |
| 2007/0125415 A1 | 6/2007 | Sachs |
| 2007/0132842 A1 | 6/2007 | Morris |
| 2007/0153860 A1 | 7/2007 | Chang-Hasnain et al. |

| | | | | | | |
|---|---|---|---|---|---|---|
| 2007/0171418 | A1 | 7/2007 | Nyhart | JP | 2001-320092 | 11/2001 |
| 2007/0196040 | A1 | 8/2007 | Wang et al. | JP | 2001-345458 | 12/2001 |
| 2007/0206267 | A1 | 9/2007 | Tung et al. | JP | 2002-062505 | 2/2002 |
| 2007/0235072 | A1 | 10/2007 | Bermel et al. | JP | 2002-229023 | 8/2002 |
| 2007/0247704 | A1 | 10/2007 | Mignard | JP | 2002 287047 | 10/2002 |
| 2007/0285761 | A1 | 12/2007 | Zhong et al. | JP | 2003-021821 | 1/2003 |
| 2008/0030657 | A1 | 2/2008 | Wu et al. | JP | 2004-111278 | 4/2004 |
| 2008/0049168 | A1 | 2/2008 | Kubota | JP | 2004-212673 | 7/2004 |
| 2008/0105298 | A1 | 5/2008 | Lu et al. | JP | 05 308871 | 11/2005 |
| 2008/0112039 | A1 | 5/2008 | Chui et al. | JP | 2005-308871 | 11/2005 |
| 2008/0151347 | A1 | 6/2008 | Chui et al. | JP | 2006-065360 | 3/2006 |
| 2008/0279498 | A1 | 11/2008 | Sampsell et al. | JP | 2007-334132 | 12/2007 |
| 2009/0078316 | A1 | 3/2009 | Khazeni | KR | 2002-010322 | 2/2002 |
| 2009/0101192 | A1 | 4/2009 | Kothari et al. | KR | 2003-0081662 | 10/2003 |
| 2009/0103161 | A1 | 4/2009 | Kothari et al. | WO | WO 94/28452 | 12/1994 |
| 2009/0103165 | A1 | 4/2009 | Kothari et al. | WO | WO 95/15582 | 6/1995 |
| 2009/0126792 | A1 | 5/2009 | Gruhlke et al. | WO | WO 97/44707 | 11/1997 |
| 2009/0219604 | A1 | 9/2009 | Miles | WO | WO99/04296 | 1/1999 |
| 2009/0251761 | A1 | 10/2009 | Khazeni et al. | WO | WO 99/67680 | 12/1999 |
| 2009/0293955 | A1 | 12/2009 | Kothari et al. | WO | WO 00/11502 | 3/2000 |
| 2010/0051089 | A1 | 3/2010 | Khazeni et al. | WO | WO 01/81994 | 11/2001 |
| 2010/0214642 | A1 | 8/2010 | Miles | WO | WO 02/27805 | 4/2002 |
| 2010/0236624 | A1 | 9/2010 | Khazeni et al. | WO | WO 2004/114418 | 12/2004 |
| 2010/0245370 | A1 | 9/2010 | Narayanan et al. | WO | WO 2006/034377 | 3/2006 |
| 2010/0284055 | A1 | 11/2010 | Kothari et al. | WO | WO 2006/137337 | 12/2006 |
| 2011/0090136 | A1 | 4/2011 | Gally | WO | WO 2007/073203 | 6/2007 |
| 2011/0128307 | A1 | 6/2011 | Gally et al. | WO | WO 2007/142978 | 12/2007 |
| 2011/0193770 | A1 | 8/2011 | Gally et al. | WO | WO 2008/067024 | 6/2008 |

FOREIGN PATENT DOCUMENTS

| | | |
|---|---|---|
| DE | 196 22 748 | 12/1997 |
| DE | 10329917 | 2/2005 |
| DE | 10 2006 039 071 | 2/2008 |
| EP | 0 223 136 | 5/1987 |
| EP | 0 362 993 | 4/1990 |
| EP | 0 622 856 | 11/1994 |
| EP | 0 667 548 | 8/1995 |
| EP | 0 843 364 | 5/1998 |
| EP | 0 855 745 | 7/1998 |
| EP | 1 003 062 | 5/2000 |
| EP | 1 014 161 | 6/2000 |
| EP | 1 275 997 | 1/2003 |
| EP | 1 369 932 | 12/2003 |
| EP | 1 403 212 | 3/2004 |
| EP | 1 670 065 | 6/2006 |
| EP | 1 691 429 | 8/2006 |
| EP | 2 051 124 | 4/2009 |
| GB | 2 396 436 | 6/2004 |
| JP | 56-088111 | 7/1981 |
| JP | 60-147718 | 8/1985 |
| JP | 02-068513 | 3/1990 |
| JP | 02 151079 | 6/1990 |
| JP | 03-199920 | 8/1991 |
| JP | 04-081816 | 3/1992 |
| JP | 04-190323 | 7/1992 |
| JP | 04 238321 | 8/1992 |
| JP | 07-199829 | 8/1995 |
| JP | 08-018990 | 1/1996 |
| JP | 8-051230 | 2/1996 |
| JP | 08-094992 | 4/1996 |
| JP | 09-068722 | 3/1997 |
| JP | 09-189910 | 7/1997 |
| JP | 09-281917 | 10/1997 |
| JP | 11-211999 | 8/1999 |
| JP | 11-227248 | 8/1999 |
| JP | 11-295725 | 10/1999 |
| JP | 11-295726 | 10/1999 |
| JP | 2000-006467 | 1/2000 |
| JP | 2001-119530 | 4/2001 |

OTHER PUBLICATIONS

Final Office Action dated Jan. 19, 2011 in U.S. Appl. No. 11/950,392, filed Dec. 4, 2007.

International Preliminary Report on Patentability mailed Apr. 16, 2010, in Application No. PCT/US2008/086284.

Nagakawa et al., Wide-Field-of-View Narrow-Band Spectral Filters Based on Photonic Crystal Nanocavities, Optical Society of America, Optics Letters, vol. 27, No. 3, pp. 191-193, 2002.

IPRP dated Jul. 1, 2010 in PCT/US08/086098.

Aratani K., et al., Surface micromachined tuneable interferometer array, Sensors and Actuators, pp. 17-23. (1994).

Lau , 1999, Chapter 5. The characterization of silicon dioxide and silicon nitride thin films, in Infrared Characterization for Microelectronics, World Scientific Publishing Co. Pte. Ltd., New Jersey, pp. 55-71.

Miles et al, Oct. 21, 1997, A MEMS based interferometric modulator (IMOD) for display applications, Proceedings of Sensors Expo, pp. 281-284.

Petschick et al., Fabry-Perot-Interferometer, Nov. 15, 2002, retrieved from the Internet: URL:http://pl.physik.tu-berlin.de/groups/pg279/protokollesse02/04_fpi.pdf> retrieved on Apr. 14, 2009.

European Search Report dated Jun. 19, 2009, in Application No. EP 08 15 3685.

International Search Report mailed Jun. 18, 2009, in Application No. PCT/US2008/086098.

International Search Report mailed Jun. 18, 2009, in Application No. PCT/US2008/086284.

International Search Report dated Mar. 27, 2009 in Application No. PCT/US2008/083678.

Pohlack, Jan. 1, 1983, Grundlagen und anwendungen der induzierten resonanzabsorptoon (Teil 1), Feingeraetetechnik, XX, XX, vol. 32, No. 7, pp. 321-326.

Specification for Pathfinder™ Watch (Model No. PAW1300-1V) on worldwide web page for Casio.com, printed on Oct. 20, 2008.

* cited by examiner

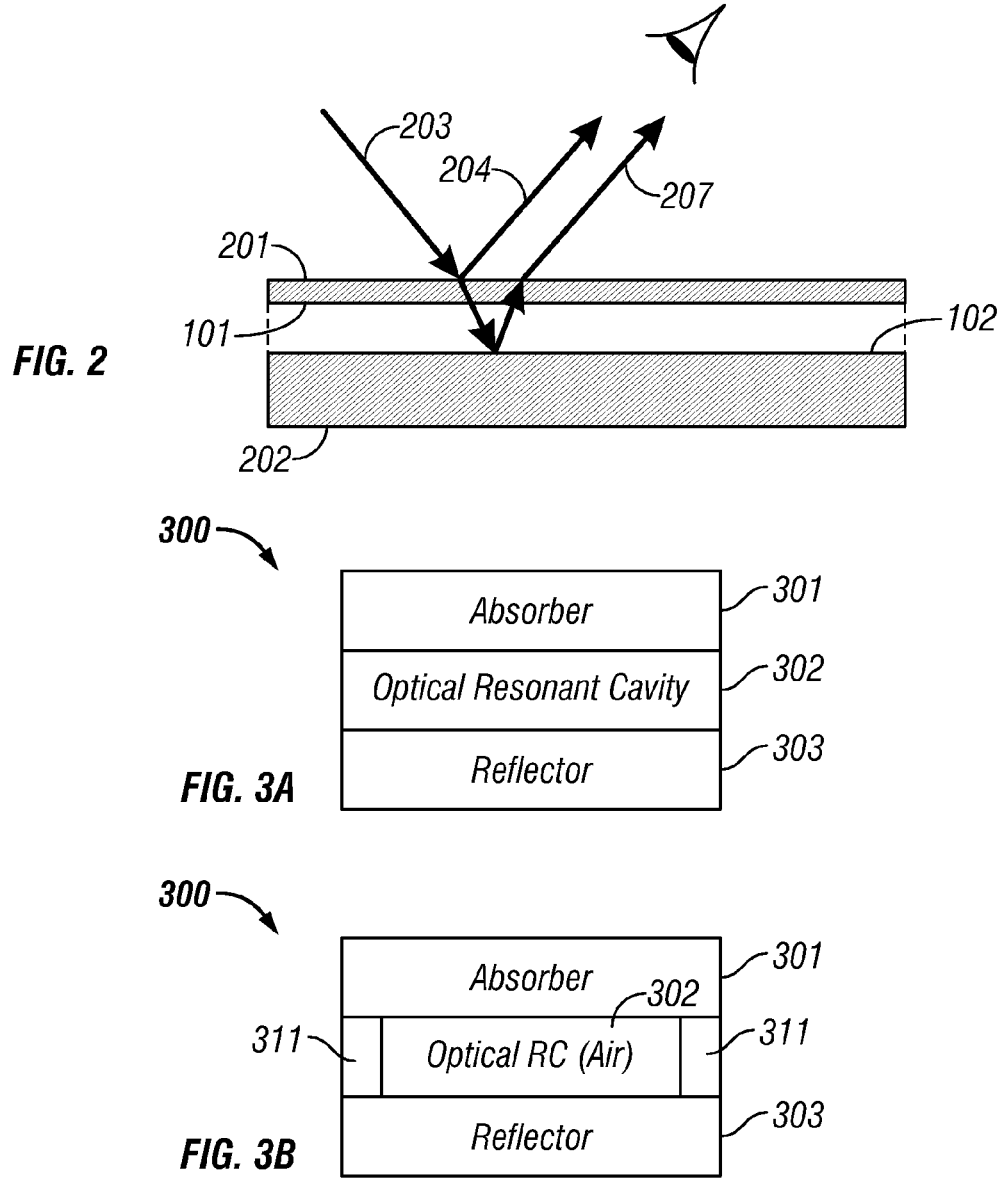

US 8,193,441 B2

PHOTOVOLTAICS WITH INTERFEROMETRIC RIBBON MASKS

CROSS-REFERENCE TO RELATED APPLICATIONS

This application claims the benefit of U.S. Provisional Patent Application No. 61/014,405, filed on Dec. 17, 2007, the entire contents of which are incorporated by reference and should be considered a part of this specification.

The present application is related to U.S. patent application Ser. No. 11/950,392, filed Dec. 4, 2007, to U.S. Provisional Application No. 61/002,198, filed on Nov. 7, 2007, and to U.S. patent application Ser. No. 12/336,839, filed on even date herewith.

BACKGROUND

1. Field of the Invention

The present invention relates generally to the field of optoelectronic transducers that convert optical energy into electrical energy, such as for example photovoltaic cells.

2. Description of the Related Technology

For over a century fossil fuel such as coal, oil, and natural gas has provided the main source of energy in the United States. The need for alternative sources of energy is increasing. Fossil fuels are a non-renewable source of energy that are depleting rapidly. The large scale industrialization of developing nations such as India and China has placed a considerable burden on the available fossil fuels. In addition, geopolitical issues can quickly affect the supply of such fuels. Global warming is also of greater concern in recent years. A number of factors are thought to contribute to global warming; however, widespread use of fossil fuels is presumed to be a main cause of global warming. Thus there is an urgent need to find a renewable and economically viable source of energy that is also environmentally safe. Solar energy is an environmentally safe renewable source of energy that can be converted into other forms of energy such as heat and electricity.

Photovoltaic (PV) cells convert optical energy to electrical energy and thus can be used to convert solar energy into electrical power. Photovoltaic solar cells can be made very thin and modular. PV cells can range in size from a few millimeters to 10's of centimeters. The individual electrical output from one PV cell may range from a few milliwatts to a few watts. Several PV cells may be connected electrically and packaged in arrays to produce sufficient amount of electricity. PV cells can be used in a wide range of applications such as providing power to satellites and other spacecraft, providing electricity to residential and commercial properties, charging automobile batteries, etc.

While PV devices have the potential to reduce reliance upon hydrocarbon fuels, the widespread use of PV devices has been hindered by inefficiency and aesthetic concerns. Accordingly, improvements in either of these aspects could increase usage of PV devices.

SUMMARY OF CERTAIN INVENTIVE ASPECTS

In one embodiment, a ribbon for a photovoltaic device is provided with an elongated conductor configured to electrically connect a plurality of photovoltaic cells. The conductor has a reflective surface. An optical resonant cavity layer is disposed on the reflective surface of the conductor. An absorber layer is disposed on the optical resonant cavity layer. The optical resonant cavity and the absorber layer are configured to interferometrically reduce reflections from the conductor.

In another embodiment, a photovoltaic ribbon is provided comprising a means for generating an electrical current from incident light on a side of said means and a means for aligning and interconnecting said electrical current generating means with additional electrical current generating means.

In another embodiment, a method of interconnecting a plurality of photovoltaic cells includes aligning a ribbon conductor along a plurality of photovoltaic cells. The ribbon conductor comprises a conductive layer, an optical resonant cavity over the conductive layer, and an absorber layer over the optical resonant cavity. The ribbon conductor is attached along the plurality of photovoltaic cells such that the ribbon conductor is operatively coupled to the photovoltaic cells and the photovoltaic cells are electrically interconnected.

In another embodiment, a method of making a ribbon conductor for a photovoltaic device includes providing a conductive strip. The conductive strip is coated with a plurality of layers. The layers form an optical resonant cavity over the conductive strip and an optical absorber layer over the optical resonant cavity, to define an interferometric modulator mask.

In another embodiment, a method of making a ribbon conductor for a photovoltaic device includes providing a conductive strip and providing a substrate having interferometric mask layers. The interferometric mask layers comprise an optical resonant cavity and an absorber layer. The substrate having the interferometric mask layers is subsequently laminated onto the conductive strip.

In another embodiment, a system is provided for converting optical energy to electrical energy. The system includes a plurality of photovoltaic cells. A conductor layer electrically connects the plurality of photovoltaic cells. A plurality of layers forms an optical interferometric modulator mask over the conductor layer. The mask is configured to mask reflections from the conductor layer.

BRIEF DESCRIPTION OF THE DRAWINGS

Example embodiments disclosed herein are illustrated in the accompanying schematic drawings, which are for illustrative purposes only.

FIG. 1 schematically illustrates a theoretical optical interferometric cavity.

FIG. 2 schematically illustrates a plurality of layers forming one implementation of an optical interferometric modulator.

FIG. 3A is a block diagram of an interferometric modulator ("IMOD") stack, similar to that of FIG. 2, comprising an absorber layer, an optical resonant cavity and a reflector.

FIG. 3B schematically illustrates an IMOD where the optical cavity includes an air gap formed by posts or pillars between the absorber and reflector layers.

DETAILED DESCRIPTION OF CERTAIN EMBODIMENTS

Figure 3C:
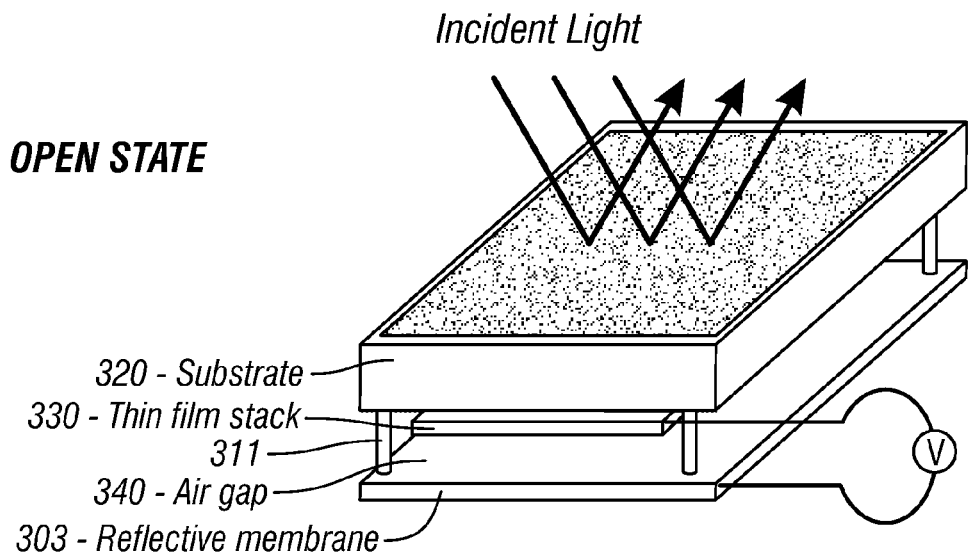
FIG. 3C illustrates an embodiment of an IMOD, wherein the optical resonant cavity can be adjusted electromechanically, in an "open" state.

One issue hindering widespread adoption of photovoltaic (PV) devices on available surfaces for conversion of light energy into electric energy or current is the undesirable aesthetic appearance of conductors or electrodes on the PV devices. The high reflectivity of common front electrode materials contrasts with the darker appearance of the active PV material itself, and furthermore hinders the blending of PV devices with surrounding materials. Embodiments described herein below employ interferometric modulator (IMOD) constructions designed to darken, hide or blend electrodes, thus providing an IMOD mask over conductors for PV devices. Light incident on the IMOD mask results in little or no visible reflection in the region of the electrodes due to the principles of optical interference. The interferometric masking effect is governed by the dimensions and fundamental optical properties of the materials making up the IMOD mask. Accordingly, the masking effect is not as susceptible to fading over time, compared to common dyes or paints.

Although certain preferred embodiments and examples are discussed herein, it will be understood that the inventive subject matter extends beyond the specifically disclosed embodiments to other alternative embodiments and/or uses of the invention and obvious modifications and equivalents thereof. It is intended that the scope of the invention disclosed herein should not be limited by the particular disclosed embodiments. Thus, for example, in any method or process disclosed herein, the acts or operations making up the method/process may be performed in any suitable sequence and are not necessarily limited to any particular disclosed sequence unless specifically noted. Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein. The following detailed description is directed to certain specific embodiments of the invention. However, the invention can be embodied in a multitude of different ways. The embodiments described herein may be implemented in a wide range of devices that include photovoltaic devices for collection and conversion of optical energy to electrical energy.

In this description, reference is made to the drawings wherein like parts are designated with like numerals throughout. As will be apparent from the following description, the embodiments may be implemented in a variety of devices that comprise photovoltaic active material.

FIG. 1 illustrates an optical resonant cavity. An example of such an optical resonant cavity is a soap film which may produce a spectrum of reflected colors. The optical resonant cavity shown in FIG. 1 comprises two interfaces or surfaces 101 and 102. The two surfaces 101 and 102 may be opposing surfaces on the same layer. For example, the two surfaces 101 and 102 may comprise surfaces on a glass or plastic plate or sheet or a film of glass, plastic, or any other transparent material. Air or other media may surround the plate, sheet, or film. In the illustrated example, light partially reflects and partially transmits at each of interfaces 101, 102.

A ray of light 103 that is incident on the front surface 101 of the optical resonant cavity is partially reflected as indicated by the light path 104 and partially transmitted through the front surface 101 along light path 105. The transmitted light may be partially reflected along light path 107 and partially transmitted out of the resonant cavity along light path 106. The amount of light transmitted and reflected may depend on the refractive indices of the material that forms the optical resonant cavity and of the surrounding medium. The example is simplified by omission of multiple internal reflections, as will be appreciated by the skilled artisan.

For purposes of the discussions provided herein, the total intensity of light reflected from the optical resonant cavity is a coherent superposition of the two reflected light rays 104 and 107. With such coherent superposition, both the amplitude and the phase of the two reflected beams contribute to the aggregate intensity. This coherent superposition is referred to as interference. The two reflected rays 104 and 107 may have a phase difference with respect to each other. In some embodiments, the phase difference between the two waves may be 180 degrees and cancel each other out. If the phase and the amplitude of the two light rays 104 and 107 are configured so as to reduce the intensity then the two light beams are referred to as interfering destructively. If on the other hand the phase and the amplitude of the two light beams 104 and 107 are configured so as to increase the intensity then the two light rays are referred to as interfering constructively. The phase difference depends on the optical path difference of the two paths, which depends both on the thickness of the optical resonant cavity, the index of refraction of the material(s) between the two surfaces 101 and 102, and whether the indices of surrounding materials are higher or lower than the material forming the optical resonant cavity. The phase difference is also different for different wavelengths in the incident beam 103. Accordingly, in some embodiments the optical resonant cavity may reflect a specific set of wavelengths of the incident light 103 while transmitting other wavelengths of the incident light 103. Thus some wavelengths may interfere constructively and some wavelengths may interfere destructively. In general, the colors and the total intensity reflected and transmitted by the optical resonant cavity thus depend on the thickness and the material(s) forming the optical resonant cavity and surrounding media. The reflected and transmitted wavelengths also depend on viewing angle, different wavelengths being reflected and transmitted at different angles.

In FIG. 2, an optical resonant cavity is defined between two layers. In particular, an absorber layer 201 defines the top or front surface 101 of the optical resonant cavity while a bottom reflector layer 202 defines the bottom or back surface 102 of the optical resonant cavity. The thicknesses of the absorber and reflector layers may be substantially different from each other. For example, the absorber layer 201 will typically be thinner than the bottom reflector layer 202 and is designed to be partially transmissive. The absorber and reflector layers may comprise metal. As shown in FIG. 2, the ray of light 203 that is incident on the absorber layer 201 of the optical interference cavity is partially reflected out of the optical interference cavity along each of the paths 204 and 207. The illumination field as viewed by an observer on the front or incident side is a superposition of the two reflected rays 204 and 207. The amount of light substantially absorbed by the device or transmitted out of the device through the bottom reflector 202 can be significantly increased or reduced by varying the thickness and the composition of the reflector layers 201, 202, whereas the apparent color of reflections is largely determined by the interference effect governed by the size or thickness of the optical resonant cavity between them and the material properties of the absorber layer 201.

In some embodiments, the optical cavity between the front and back surfaces 101, 102 is defined by a layer, such as an optically transparent dielectric layer, or plurality of layers. In other embodiments, the optical resonant cavity between the front and back surfaces 101, 102 is defined by an air gap or combination of optically transparent layer(s) and an air gap. The size of the optical interference cavity may be tuned to maximize or minimize the reflection of one or more specific colors of the incident light. The color or colors reflected by the optical interference cavity may be changed by changing the thickness of the cavity. Accordingly, the color or colors reflected by the optical interference cavity may depend on the thickness of the cavity. When the cavity height is such that particular wavelength(s) are maximized or minimized by optical interference, the structure is referred to herein as an interferometric modulator (IMOD). An IMOD may be static (fixed) or dynamic (active).

In certain embodiments, the optical resonant cavity height between the top absorber and the bottom reflector may be actively varied for example by microelectromechanical systems (MEMS). MEMS include micromechanical elements, actuators, and electronics. Micromechanical elements may be created using deposition, etching, and/or other micromachining processes that etch away or remove parts of substrates and/or deposited material layers or that add layers to form electrical and electromechanical devices. Such MEMS devices include IMODs having an optical resonant cavity that can be adjusted electromechanically. An IMOD selectively absorbs and/or reflects light using the principles of optical interference. In certain embodiments, an interferometric modulator may comprise a pair of conductive plates, one of which is partially reflective and partially transmissive and the other of which is partly or totally reflective. The conductive plates are capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. In this manner, the color of light output by a MEMS interferometric modulator (IMOD) can be actively varied.

Using such a MEMS-adjustable optical interference cavity, or MEMS IMOD, it is possible to provide at least two states. A first state comprises an optical interference cavity of a certain dimension whereby light of a selected color (based upon the size of the cavity) interferes constructively and is reflected out of the cavity. A second state comprises a visible black state produced due to constructive and/or destructive interference of light, such that visible wavelength are substantially absorbed. Alternatively, the two states can be colored and broad spectrum (white) reflective.

FIG. 3A is a simplified schematic of an IMOD stack 300. As illustrated, the IMOD stack 300 comprises an absorber layer 301, a reflector 303, and an optical resonant cavity 302 formed between the absorber layer 301 and the reflector 303. The reflector 303 may, for example, comprise a metal layer, such as aluminum, and is typically thick enough to be opaque (e.g., 300 nm). The optical resonant cavity 302 may comprise an air gap and/or one or more optically transparent materials. If the optical resonant cavity 302 is defined by a single layer between the reflector 303 and the absorber layer 301, a transparent conductor or transparent dielectric may be used. In some embodiments, the optical resonant cavity 302 can comprise a composite structure comprising multiple materials that may include two or more of an air gap, a transparent conducting material, and a transparent dielectric layer. A possible advantage of multiple layers and/or air gaps is that selected layers of the stack may serve multiple functions, such as device passivation or scratch resistance in addition to its optical role in the IMOD stack 300. In some embodiments, the optical resonant cavity may comprise one or more partially transparent materials, whether conductive or dielectric. Exemplary transparent materials for the optical interference cavity 302 may comprise a transparent conductive oxide (TCO), such as indium tin oxide (ITO), and/or a dielectric, such as silicon dioxide ($SiO_2$).

In this embodiment light passes through the IMOD stack 300 first by passing into the absorber layer 301. Some light passes through the partially transmissive absorber layer 301, through the optical interference cavity 302, and is reflected off the reflector 303 back through the optical resonant cavity 302 and through the absorber layer 301.

With reference to FIG. 3B, in other embodiments, the thickness of the optical resonant cavity 302 may comprise an air gap 302 supported by spacers 311, such as rails, posts or pillars. Within the IMOD 300, the optical resonant or interference cavity 302 may be an air gap that is static, or one that is dynamic, i.e., variable using, for example, MEMS technology.

An interferometric modulator (IMOD) structure such as shown in FIG. 3A or 3B selectively produces a desired reflection output using optical interference. This reflected output may be "modulated" by selection of the thickness and optical properties of the optical resonant cavity 302, as well as the thickness and optical properties of the absorber 301 and the reflector 303. The reflected output may also be varied dynamically using a MEMS device to change the size of the optical resonant cavity 302. The color observed by a viewer viewing the surface of the absorber 301 will correspond to those frequencies that are substantially reflected out of the IMOD and are not substantially absorbed or destructively interfered by the various layers of the IMOD. The frequencies that interfere and are not substantially absorbed can be varied by selecting the thickness of the optical resonant cavity 302.

Figure 3D:
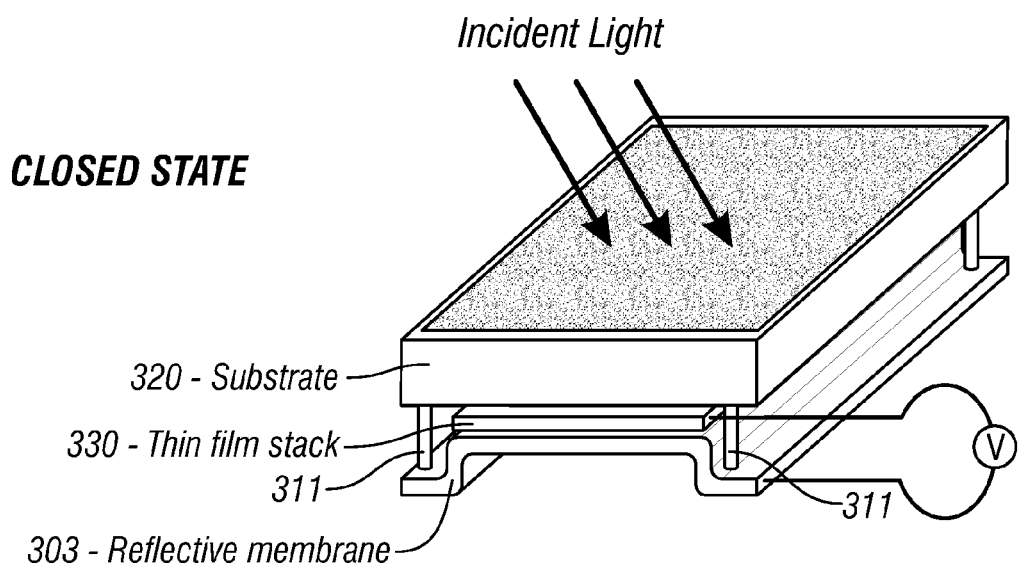
FIG. 3D illustrates an IMOD, wherein the optical resonant cavity can be adjusted electromechanically, in a "closed" state.

FIGS. 3C and 3D show an embodiment of an IMOD wherein the optical resonant cavity (302 in FIG. 3B) includes an air gap and can be electromechanically changed using MEMS technology. FIG. 3C illustrates an IMOD configured to be in the "open" or "relaxed" state and FIG. 3D illustrates an IMOD configured to be in the "closed" or "collapsed" state. The IMOD illustrated in FIGS. 3C and 3D comprises a substrate 320, a thin film stack 330 and a reflective membrane 303. The thin film stack 330 may comprise an absorber (corresponding to 303 in FIGS. 3A and 3B) as well as other layers and materials, such as a separate transparent electrode layer and a dielectric layer to keep the electrodes insulated from one another. In some embodiments, the thin film stack 330 may be attached to the substrate 320. In the "open" state, the thin film stack 330 is separated from the reflective membrane 303 by a gap 340. In some embodiments, for example, as illustrated in FIG. 3C, the gap 340 may be an air gap, supported by spacers 311, such as rails, pillars or posts. In the "open" state, the thickness of the gap 340 can vary, for example, between 120 nm and 400 nm (e.g., approximately 260 nm) in some embodiments. Hence, in the "open" state, the optical resonant cavity of FIGS. 3A and 3B comprises the air gap together with any transparent layers over the absorber within the thin film stack 330.

In certain embodiments, the IMOD can be switched from the "open" state to the "closed" state by applying a voltage difference between the thin film stack 330 and the reflective membrane 303 as illustrated in FIG. 3D. In the "closed" state, the optical cavity over the absorber between the thin film stack 330 and the reflective membrane 303 is defined by, e.g., a dielectric layer overlying the absorber in the thin film stack 330, and is typically configured to reflect "black" or minimal visible reflections. The thickness of the air gap in general can vary between approximately 0 nm and approximately 2000 nm, for example, between "open" and "closed" states in some embodiments.

In the "open" state, one or more frequencies of the incident light interfere constructively above the surface of the substrate 320. Accordingly, some frequencies of the incident light are not substantially absorbed within the IMOD but instead are reflected from the IMOD. The frequencies that are reflected out of the IMOD interfere constructively outside the IMOD. The display color observed by a viewer viewing the surface of the substrate 320 will correspond to those frequencies that are substantially reflected out of the IMOD and are not substantially absorbed by the various layers of the IMOD. The frequencies that interfere constructively and are not substantially absorbed can be varied by changing the thickness of the optical cavity (which includes the gap 340), thereby changing the thickness of the optical resonant cavity.

Figure 4:
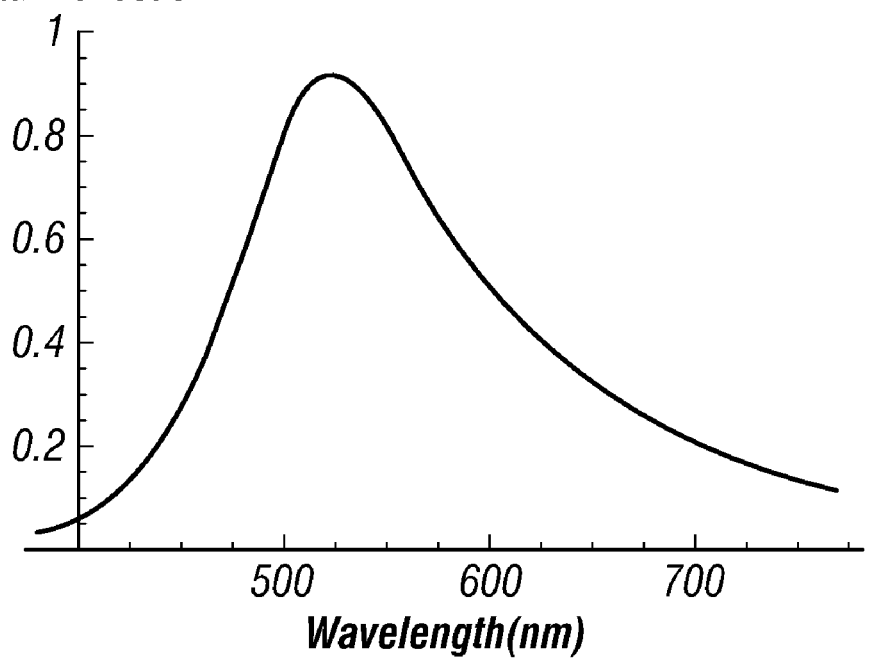
FIG. 4 shows the total reflection versus wavelength of an interferometric light modulator with an optical cavity configured to reflect yellow for normally incident broadband white light.

FIG. 4 illustrates a graph of total reflection of an IMOD (for example, the IMOD 300 of FIG. 3A or 3B) versus wavelength as seen from a direction normal or perpendicular to the front surface of the IMOD. The graph of total reflection shows a reflection peak at approximately 550 nm (yellow). A viewer viewing the IMOD will observe the IMOD to be yellow. As mentioned previously, the location of the peak of the total reflection curve can be shifted by changing either the thickness or material of the optical resonant cavity 302 or by changing the material and thickness of one or more layers in the stack.

Figure 5:
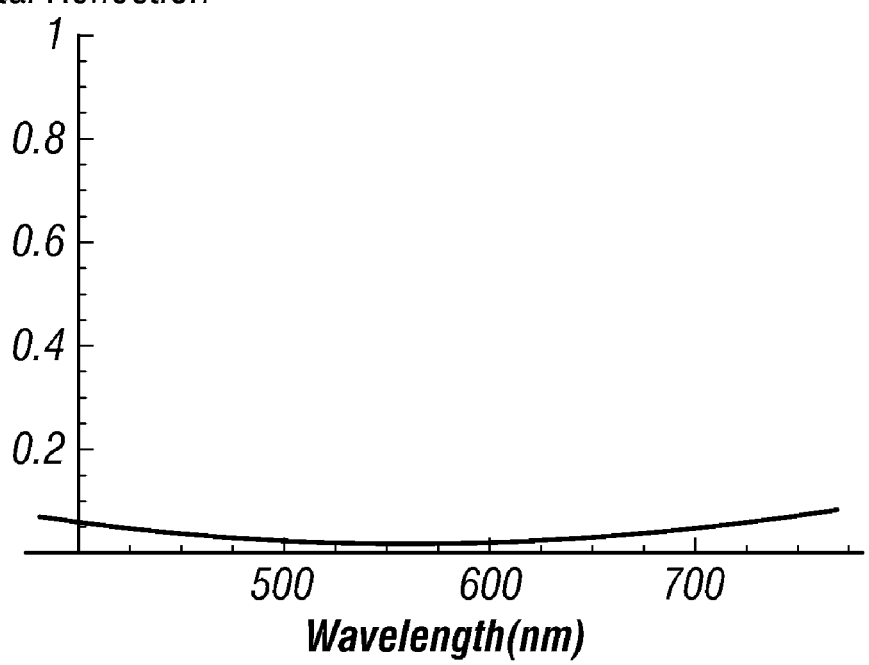
FIG. 5 shows the total reflection versus wavelength with an optical cavity configured to minimize visible reflections for normally incident broadband white light.

FIG. 5 illustrates a graph of total reflection of the IMOD versus wavelength over a wavelength range of approximately 400 nm to 800 nm for an IMOD with an optical cavity thickness selected to minimize reflections in the visible range. It is observed that the total reflection is uniformly low in the entire visible wavelength range. Thus very little light is reflected out of the interferometric modulator. The color observed by a viewer looking perpendicularly at the front surface of the IMOD may generally be black, reddish black or purple in some embodiments.

Figure 6:
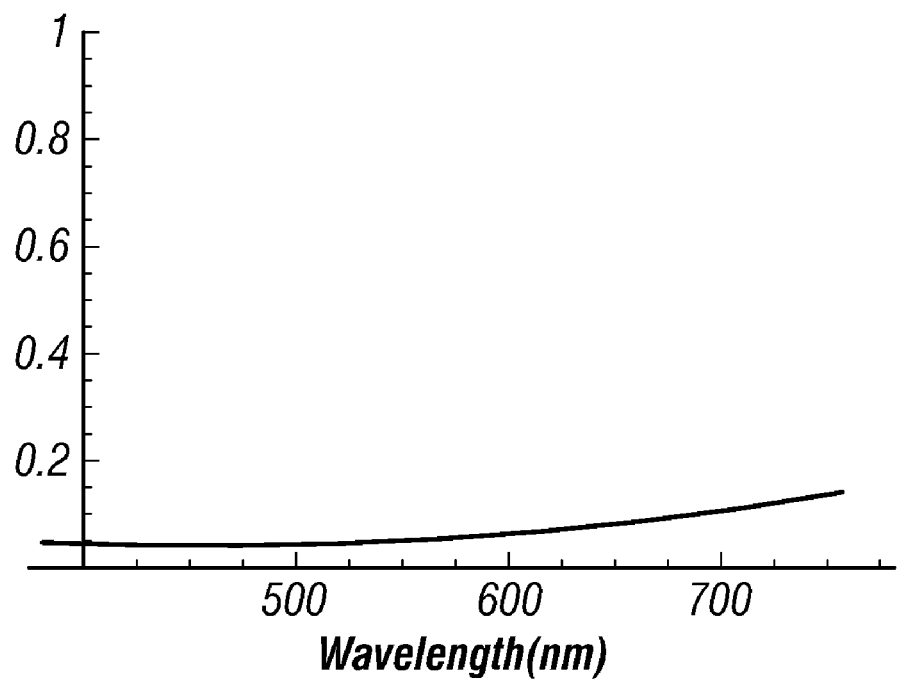
FIG. 6 shows the total reflection versus wavelength of an interferometric light modulator like that of FIG. 5 when the angle of incidence or view angle is approximately 30 degrees to normal.

Generally, an IMOD stack can have a view angle dependency. However, when an optical resonant cavity is selected to minimize IMOD reflection in the visible range, the angle dependency tends to be fairly low. FIG. 6 illustrates total reflection versus wavelength for an IMOD with an optical resonant cavity, optimized to minimize visible reflections, when the angle of incidence or view angle is 30 degrees. It is observed that the total reflection is uniformly low in the entire visible wavelength range. Thus very little visible light is reflected out of the interferometric modulator. A comparison of FIGS. 5 and 6 shows that the spectral response of the IMOD with a cavity 302 chosen or modulated to minimize visible reflection is approximately the same for normal incidence and when the angle of incidence or view angle is 30 degrees. In other words, the spectral response of a "black"

IMOD, with a cavity selected to minimize visible reflections, does not exhibit a strong dependency on the angle of incidence or the view angle.

Figure 7:
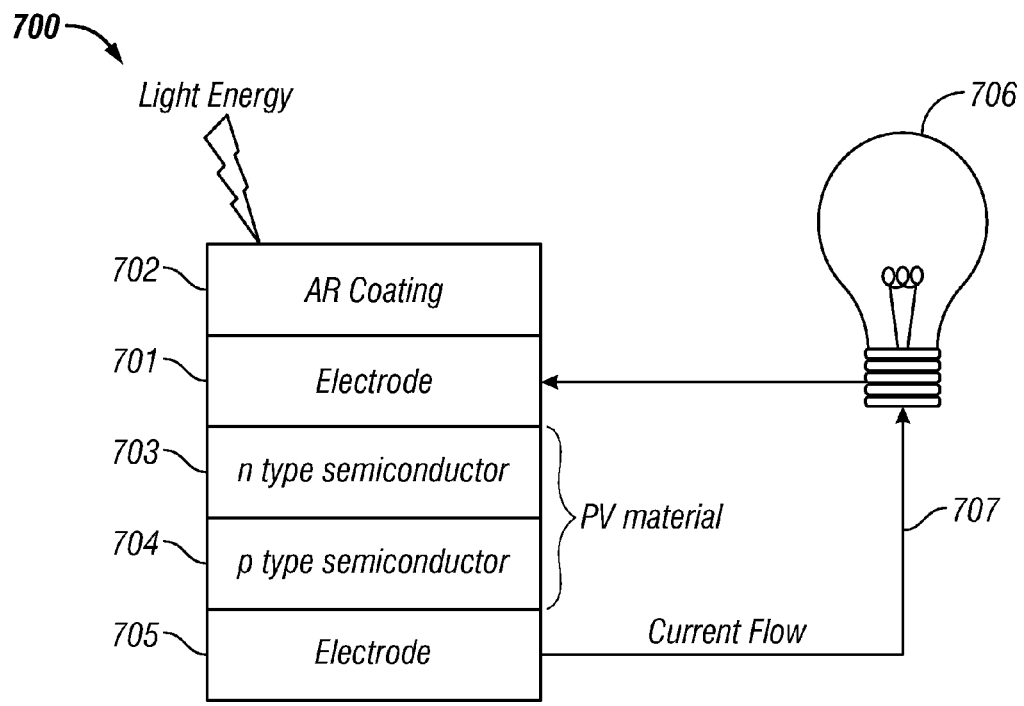
FIG. 7 schematically illustrates a photovoltaic cell comprising a p-n junction.

FIG. 7 shows a typical photovoltaic (PV) cell 700. A typical photovoltaic cell can convert light energy into electrical energy or current. A PV cell is an example of a renewable source of energy that has less impact on the environment, e.g., a small carbon footprint. Using PV cells can provide possible cost benefits, such as reducing the cost of energy generation. PV cells can have many different sizes and shapes, e.g., from smaller than a postage stamp to several inches across. Several PV cells can often be connected together to form PV cell modules that may be up to several feet long and a few feet wide. Modules, in turn, can be combined and connected to form PV arrays of different sizes and power output.

The size of an array can depend on several factors, such as the amount of sunlight available in a particular location and the needs of the consumer. The modules of the array can include electrical connections, mounting hardware, power-conditioning equipment, and batteries that store solar energy for use when the sun is not shining. A PV device can be a single cell with its attendant electrical connections and peripherals, or a PV module or a PV array. A PV device can also include functionally unrelated electrical components, e.g., components that are powered by the PV cell(s).

A typical PV cell comprises a PV active region disposed between two electrodes. In some embodiments, the PV cell comprises a substrate on which a stack of layers is formed. The PV active layer of a PV cell may comprise a semiconductor material such as silicon. In some embodiments, the active region may comprise a p-n junction formed by contacting an n-type semiconductor material 703 and a p-type semiconductor material 704 as shown in FIG. 7. Such a p-n junction may have diode-like properties and may therefore be referred to as a photodiode structure as well.

The PV active layer(s) 703, 704 are sandwiched between two electrodes that provide an electrical current path. The back electrode 705 can be formed of aluminum, silver, molybdenum or some other conducting material. The back electrode can be rough and unpolished. The front electrode 701 is designed to cover a significant portion of the front surface of the p-n junction so as to lower contact resistance and increase collection efficiency. In embodiments wherein the front electrode 701 is formed of an opaque material, the front electrode 701 is configured to leave openings or windows over the front of the PV active layer to allow illumination to impinge on the PV active layer. In some embodiments, the front electrodes can include a transparent conductor, for example, transparent conducting oxide (TCO) such as tin oxide ($SnO_2$) or indium tin oxide (ITO). The TCO can provide good electrical contact and conductivity and simultaneously be transparent to the incoming light. In some embodiments, the PV cell can also comprise a layer of anti-reflective (AR) coating 702 disposed over the front electrode 701. The layer of AR coating 702 can reduce the amount of light reflected from the front surface of the PV active layer(s) 703, 704.

When the front surface of the active PV material is illuminated, photons transfer energy to electrons in the active region. If the energy transferred by the photons is greater than the band-gap of the semiconducting material, the electrons may have sufficient energy to enter the conduction band. An internal electric field is created with the formation of the p-n junction. The internal electric field operates on the energized electrons to cause these electrons to move, thereby producing a current flow in an external circuit 707. The resulting current flow can be used to store charge or directly power various electrical devices, such as a light bulb 706 as shown in FIG. 7.

In some embodiments, the p-n junction shown in FIG. 7 can be replaced by a p-i-n junction wherein an intrinsic or undoped semiconducting layer is sandwiched between a p-type and an n-type semiconductor. A p-i-n junction may have higher efficiency than a p-n junction. In some other embodiments, the PV cell can comprise multiple junctions.

The PV active layer(s) can be formed by any of a variety of light absorbing, photovoltaic materials such as crystalline silicon (c-silicon), amorphous silicon (α-silicon), cadmium telluride (CdTe), copper indium diselenide (CIS), copper indium gallium diselenide (CIGS), light absorbing dyes and polymers, polymers dispersed with light absorbing nanoparticles, III-V semiconductors such as GaAs, etc. Other materials may also be used. The light absorbing material(s) where photons are absorbed and energy transferred to electrical carriers (holes and electrons) is referred to herein as the PV active layer of the PV cell, and this term is meant to encompass multiple active sub-layers. The material for the PV active layer can be chosen depending on the desired performance and the application of the PV cell.

In some embodiments, the PV cell can be formed by using thin film technology. For example, in one embodiment, where optical energy passes through a transparent substrate, the PV cell may be formed by depositing a first or front electrode layer of TCO on a substrate. PV active material is deposited on the first electrode layer. A second electrode layer can be deposited on the layer of PV active material. The layers may be deposited using deposition techniques such as physical vapor deposition techniques, chemical vapor deposition techniques, electrochemical deposition techniques, etc. Thin film PV cells may comprise amorphous or polycrystalline materials such as thin-film silicon, CIS, CdTe or CIGS. Some advantages of thin film PV cells are small device footprint and scalability of the manufacturing process, among others.

Figure 8:
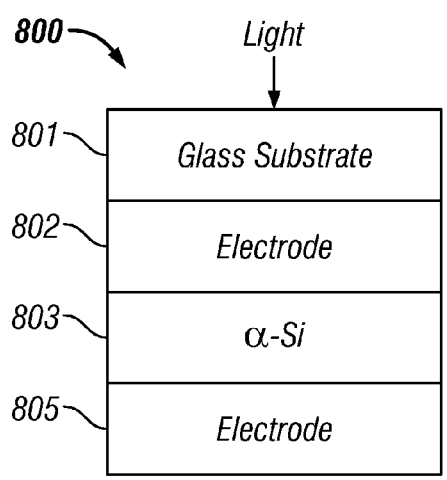
FIG. 8 is a block diagram that schematically illustrates a photocell comprising a deposited thin film or deposited photovoltaic active material.

FIG. 8 is a block diagram schematically illustrating a typical thin film PV cell 800. The typical PV cell 800 includes a glass substrate 801 through which light can pass. Disposed on the glass substrate 801 are a first electrode layer 802, a PV active layer 803 (shown as comprising amorphous silicon), and a second electrode layer 805. The first electrode layer 802 can comprise a transparent conducting material such as ITO. As illustrated, the first electrode layer 802 and the second electrode layer 805 sandwich the thin film PV active layer 803 therebetween. The illustrated PV active layer 803 comprises an amorphous silicon layer. As is known in the art, amorphous silicon serving as a PV material may comprise one or more diode junctions. Furthermore, an amorphous silicon PV layer or layers may comprise a p-i-n junction wherein a layer of intrinsic silicon is sandwiched between a p-doped layer and an n-doped layer.

Figure 9A:
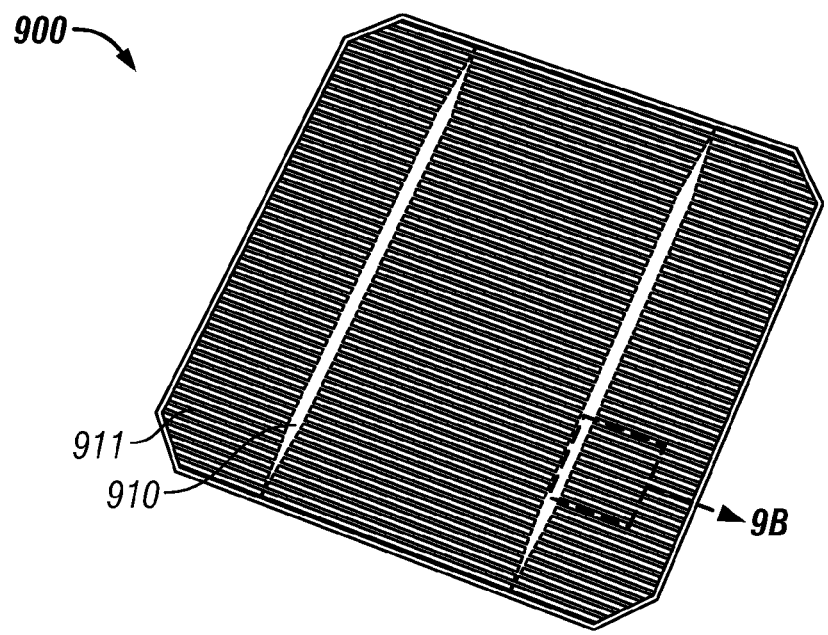
FIGS. 9A and 9B are schematic plan and isometric sectional views depicting an example of a solar photovoltaic device with visible reflective electrodes on the front side.
Figure 9B:
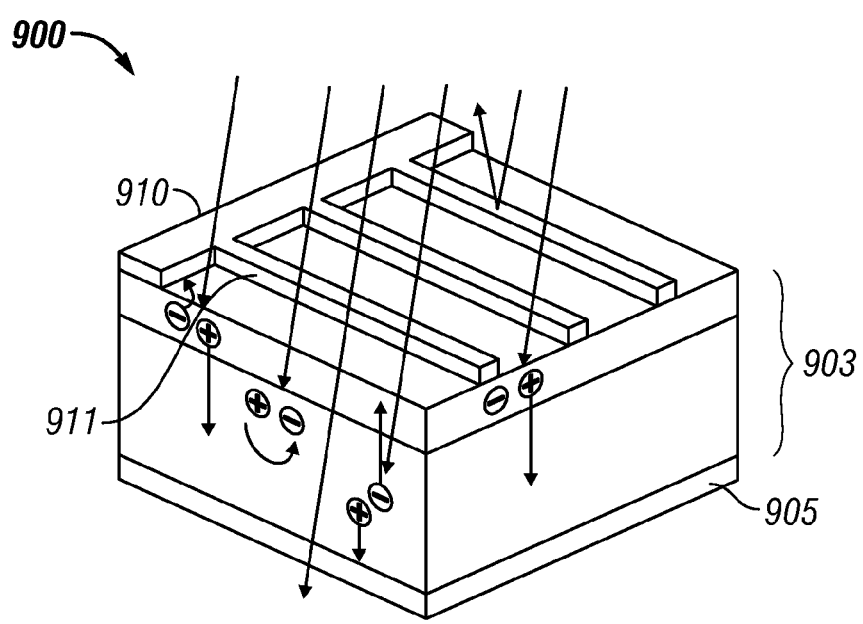

As illustrated in FIGS. 9A and 9B, many PV devices employ specular or reflective conductors 910, 911 on a front, or light-incident, side of the device, as well as on a back side of the PV device 900. Conductors on the front or light-incident side can comprise bus electrodes 910 or gridline electrodes 911. When optical energy is absorbed by the PV active material 903, electron-hole pairs are generated. These electrons and holes can generate current by moving to one or the other of the front electrodes 910, 911 or back electrodes 905, as shown in FIG. 9B. The front conductors or electrodes 910, 911 are patterned to both reduce the distance an electron or hole must travel to reach an electrode while also allowing enough light to pass through to the PV active layer 903. However, the lines of bright reflections generated by these electrodes are often considered to be unattractive, such that PV devices are often not employed in visible locations.

Accordingly, some embodiments below describe methods of covering unsightly electrodes so that the electrode pattern appears dark or black to better match the appearance of exposed PV active regions. Furthermore, some embodiments described below provide photovoltaic devices that are uniform in appearance so that they can better blend in with surrounding structures (e.g., rooftop tiles). This may be achieved either by darkening the portion of the front of the PV device that has patterned electrodes, or by rendering the entire front surface (electrodes and active regions) of the photovoltaic device dark.

One way of darkening or otherwise masking the electrode so as to suppress reflections from a conducting layer or electrode is to use an interferometric modulator (IMOD) as a mask, with reflectance tuned to darken the electrodes and/or blend with the color appearance of exposed PV active regions. In the IMOD stack, the function of the IMOD reflector (e.g., reflector 303 of FIG. 3A or 3B) can be served by the conductor being masked (e.g., front bus electrodes 910 or grid line electrodes 911 of FIGS. 9A and 9B). Light incident on the IMOD mask results in little or no visible reflection in the region of the electrodes due to the principles of optical interference discussed above. Advantageously, the interferometric effect is governed by the thickness and material(s) of the absorber and optical resonant cavity. Accordingly, the masking effect is not as susceptible to fading over time compared to common dyes or paints.

Figure 10A:
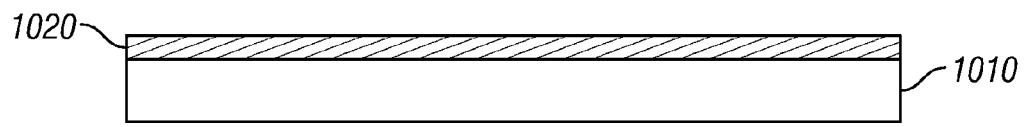
FIGS. 10A-10G are schematic cross-sectional views illustrating steps in a process of manufacturing an embodiment of an interferometric modulator (IMOD) mask integrated with a photovoltaic device, where the IMOD mask is patterned together with photovoltaic device front electrodes.

FIGS. 10A-10G illustrate one example of a process for fabricating a PV device incorporating an IMOD mask on front electrodes. The example employs a deposited thin film of PV active material. In one embodiment, such a photovoltaic device may be formed on a substrate 1010 such as plastic, glass or another suitable workpiece. As illustrated in FIG. 10A, a method of manufacturing such a device can comprise forming a back electrode 1020 on a substrate 1010 using known methods. A metal layer may be deposited to serve as the back electrode 1020 for a photovoltaic device, but non-metal conducting materials can also be used.

Figure 10B:
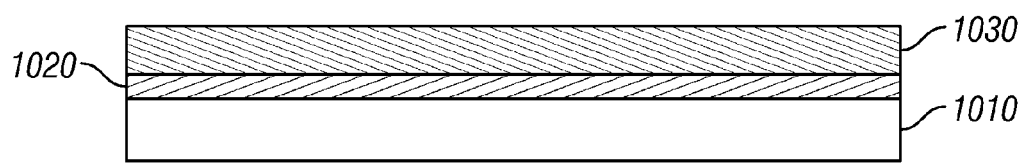

With reference to FIG. 10B, the method further includes formation of a photovoltaic active material 1030. In the illustrated embodiment, the photovoltaic (PV) active material 1030 comprises a deposited thin film, although in other arrangements portions of single crystal, semiconductor substrates and/or epitaxial layers thereover are employed. A deposited PV active material can comprise, for example, an amorphous silicon thin film, which has recently been gaining in popularity. Amorphous silicon as thin films can be deposited over large areas by physical vapor deposition (PVD), chemical vapor deposition (CVD), electrochemical vapor deposition, or plasma-enhanced chemical vapor deposition (PECVD), as well as by other methods known to those of skill in the art. As is known by those with skill in the art, PV active materials comprising amorphous silicon layers may include one or more junctions with n-doped and/or p-doped silicon and may further comprise p-i-n junctions. Other appropriate materials for the PV active material 1030 include germanium (Ge), Ge alloys, and alloys like copper indium gallium selenide (CIGS), cadmium telluride (CdTe), as well as III-V semiconductor materials, or tandem multi-junction photovoltaic materials and films. III-V semiconductor materials include such materials as gallium arsenide (GaAs), indium nitride (InN), gallium nitride (GaN), boron arsenide (BAs). Semiconductor alloys like indium gallium nitride may also be used. Other photovoltaic materials and devices are also possible. Methods of forming these materials are known to those having skill in the art. As an illustrative example, alloys like CIGS can be formed by a vacuum-based process where copper, gallium, and indium are co-evaporated or co-sputtered then annealed with a selenide vapor to form the final CIGS structure. Non-vacuum-based alternative processes are also known to those of skill in the art.

Figure 10C:
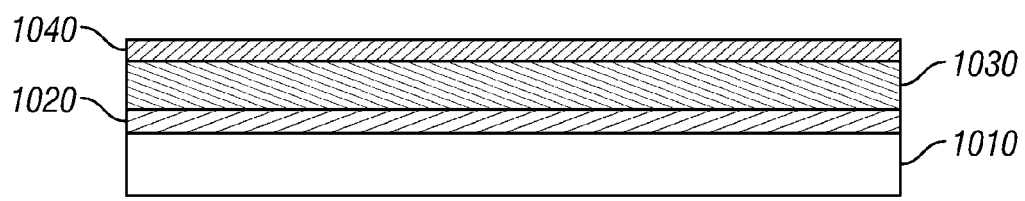

In FIG. 10C, a transparent conducting oxide (TCO) 1040 is optionally deposited over the PV active material 1030. TCO layers are often used with photovoltaic materials, particularly thin film photovoltaic materials, in order to improve electrode contact to the PV active layer 1030. Functionally the TCO 1040 forms a part of the front electrodes completing a circuit for carrying current generated by the PV active material 1030, but conventionally the more conductive metal conductors that overlie the TCO 1040 and connect the PV cell to a wider circuit are referred to as the front electrodes. As is known to those with skill in the art, a common TCO is indium tin oxide (ITO). Methods of forming or depositing ITO are well known in the art and include electron beam evaporation, physical vapor deposition, or sputter deposition techniques. Other TCO materials and processes of manufacture may also be used. The TCO layer can be omitted in other embodiments.

Figure 10D:
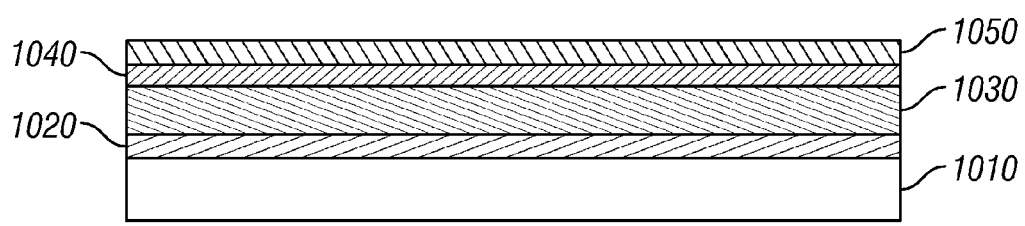

In FIG. 10D, deposition of the TCO material 1040 is followed by the forming of a front conductor layer 1050. The front conductor layer 1050 may comprise a metal or highly conductive material to serve as a front electrode and connect the PV cell into a circuit that carries current generated by the PV cell. As noted above, such conductors tend to be fairly reflective and can spoil the appearance of the PV device and hinder widespread use of PV devices. Typical reflective materials for the front conductor layer 1050 include aluminum (Al), molybdenum (Mo), zirconium (Zr), tungsten (W), iron (Fe), silver (Ag), and chromium (Cr).

Figure 10E:
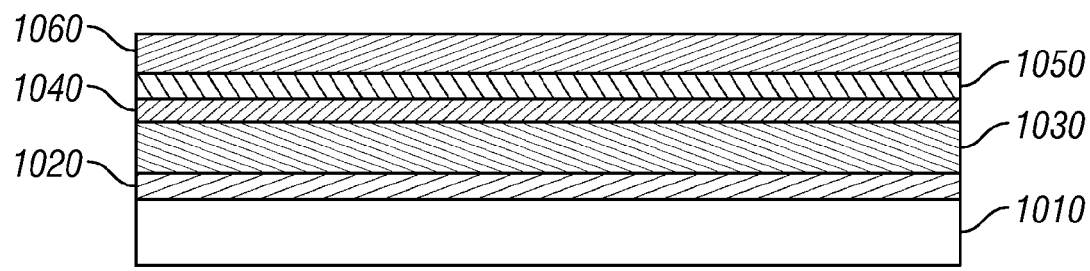

As shown in FIG. 10E, an optical resonant cavity 1060 is formed over the front conductor 1050. In the illustrated embodiment, the optical resonant cavity 1060 is a deposited transparent layer, although, as discussed above with respect to FIGS. 3A and 3B, in other arrangements the cavity can comprise an air gap (see FIG. 3B) defined by spacers, such as posts, pillars or rails; a single transparent conductive or dielectric layer; a composite formed by multiple conductive or dielectric transparent layers; or a composite formed by combination of an air gap with one or more transparent layers. Optical resonant cavities of a single layer of transparent material can simplify manufacturing and reduce costs. Composite structures with multiple layers and/or air gaps can employ multiple layers to serve multiple functions, such as device passivation or scratch resistance, in addition to its optical role in the IMOD mask being formed.

Air gaps or composite optical resonant cavities can also serve multiple functions, such as device ventilation or providing the ability to employ MEMS for either reflecting multiple colors (e.g., a color mode and a black mask mode) or for forming an actively (electrically) tunable IMOD mask. In the illustrated embodiments where the reflector 303 of the IMOD mask also serves as a front electrode for a PV device, the reflector 303 can be used as a stationary electrode for electrostatic actuation, for example, when the PV device is not active. The absorber 301 can act as a movable electrode. The skilled artisan will appreciate that interconnection and external circuits for handling dual functions of electrostatic MEMS operation and current collection from a PV device can be integrated with the active IMOD mask of the PV device.

The optical resonant cavity 1060 of one embodiment is formed by a layer of $SiO_2$ or other transparent dielectric material. A suitable thickness for an $SiO_2$ (or similar index) optical resonant cavity 1060 is between 300 Å (angstroms)

and 1000 Å to produce an interferometric dark or black effect. Methods of depositing or forming $SiO_2$ are known in the art, including CVD as well as other methods. Other suitable transparent materials for forming the optical resonant cavity 1060 include ITO, $Si_3N_4$, and $Cr_2O_3$. The optical resonant cavity 1060 of another embodiment is formed by an air gap layer and $SiO_2$ or another transparent dielectric material. A suitable thickness for an air gap optical resonant cavity 1060 is between 450 Å and 1600 Å to produce an interferometric dark or black effect.

Figure 10F:
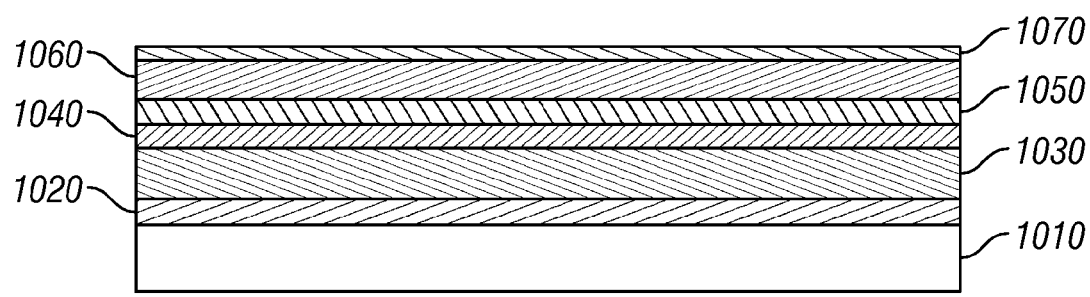

Referring to FIG. 10F, an absorber layer 1070 is formed over the optical resonant cavity 1060. In the illustrated embodiment, where the IMOD mask being constructed is designed to interferometrically darken the appearance of the naturally reflective front conductor 1050, the absorber layer 1070 may comprise, for example, semitransparent thicknesses of metallic or semiconductor layers. The absorber layer may also comprise materials that have a non-zero n*k, i.e., a non-zero product of the index of refraction (n) and extinction coefficient (k). In particular, chromium (Cr), molybdenum (Mo), molybdenum-chromium alloy (MoCr), titanium (Ti), silicon (Si), tantalum (Ta) and tungsten (W) all form suitable layers. In one embodiment, the thickness of the absorber layer 1070 is between 20 Å and 300 Å. The thickness is selected to be less than that which produces an opaque layer.

Figure 10G:
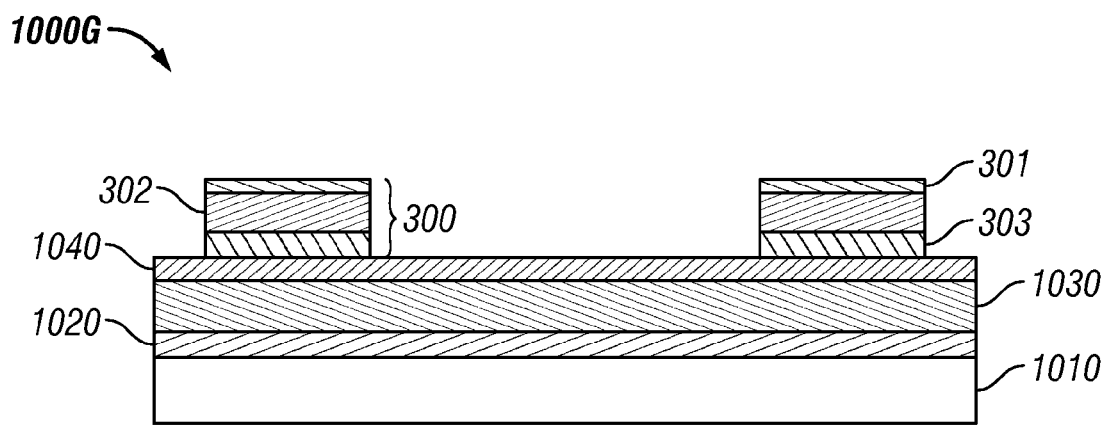

With reference to FIG. 10G, the stack illustrated in FIG. 10F is then patterned using, e.g., photolithographic patterning and etching or another suitable technique to form a PV device 1000G as shown in FIG. 10G. The resultant interferometric modulator (IMOD) mask 300 comprises a reflector 303 (also serving as a front conductor or electrode for the PV device), an optical resonant cavity 302 (referred to by reference number 1060 prior to patterning), and a patterned absorber 301. In the embodiment of FIG. 10G, the reflector 303, optical resonant cavity 302, and the absorber 301 are patterned together and hence aligned with one another. In other arrangements, components of the IMOD mask 300 may have a pattern that differs in some fashion from the pattern of the conductor that serves as the IMOD mask reflector 303, as will be better understood from the discussion of FIG. 12 below. The IMOD mask 300 thus covers the front electrode or reflector 303. Alignment of the IMOD mask 300 with the reflectors 303 that serve as front electrodes for the PV device risks some minimal reflections from the sides of the reflectors 303 at acute viewing angles. On the other hand, the absorber 301 is patterned in a fashion that does not prevent any more light from reaching the PV active layer than the reflector 303, which is present anyway as a front electrode, already does. Thus, the absorber 301 is patterned in a manner that avoids any further reduction in PV efficiency.

The materials and dimensions of the absorber 301 and the optical resonant cavity 302 are selected to reduce reflectivity from the underlying reflector 303. Reflectivity is defined as a ratio of [the intensity of light reflected from the IMOD mask 300] to [the intensity of incident light upon the top of the IMOD mask 300] in the direction normal to the upper surface of the mask 300. Common PV device front electrode materials for the reflector 303 exhibit reflectivity in the range of 30%-90%. The IMOD mask 300, however, is configured to interferometrically reduce the overall reflectivity to less than 10%. Thus, the reflectivity observable above the IMOD mask 300 is for most common front electrode (reflector 303) materials less than 10% (at which point the reflections tend to appear "gray"), and more typically less than 5%. The skilled artisan will appreciate, in view of the disclosure herein, that reflectivity can be reduced to as little as 1%-3%, thus truly appearing "black," by proper selection of the materials and dimensions for the layer(s) in the absorber 301 and the optical resonant cavity 302.

Thus, little or no light is seen reflecting from the front conductor of the PV device by an observer. Hence the pattern formed by the IMOD mask 300 covering the electrode may appear dark or black. Alternatively, the structure of the IMOD mask 300 is selected to reflect a color substantially matching the color of visible regions of the photovoltaic active material adjacent the front conductor. For most PV devices, the PV active area appears quite dark, such that reducing visible reflection by way of the IMOD mask 300 effectively blends the conductors in with the appearance of the PV active area, making it difficult to distinguish the two regions of the PV device by sight. However, to the extent the visible regions of PV active material demonstrate color(s) other than dark or black, either due to unconventional PV materials or other coatings over the windows over the PV active material, the IMOD mask 300 may be constructed to reflect other colors in order to match with the visible regions of the PV active area and produce a uniform color or appearance for the PV device.

In one example, where the optical resonant cavity 302 comprises an air gap defined by spacers, such as posts, pillars or rails (see FIG. 3B), a suitable height of the air gap for producing a dark or black IMOD mask 300 is between 450 Å and 1600 Å, depending in part on the other materials selected for the IMOD mask 300. In another example, where the optical resonant cavity 302 comprises a dielectric with an index of refraction between 1 and 3 (e.g., $SiO_2$), a dark or black IMOD mask 300 can be produced with a dielectric thickness between 300 Å and 1000 Å.

Figure 10H:
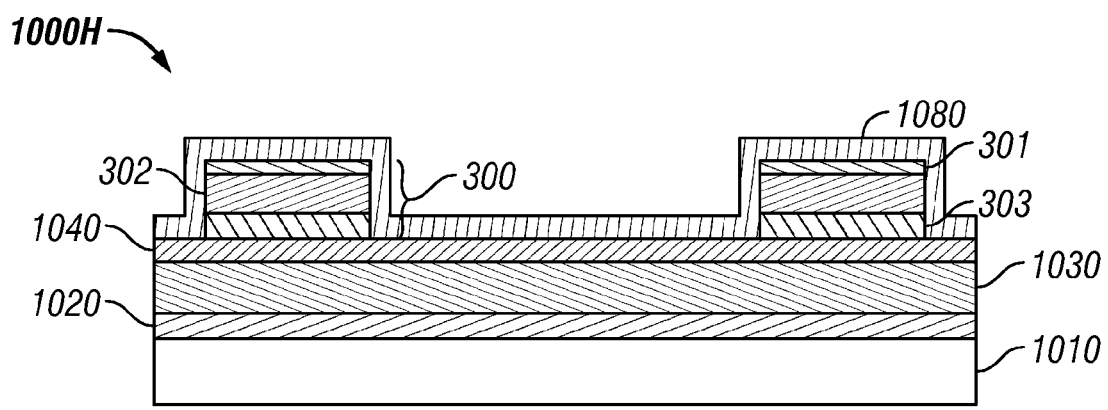
FIG. 10H is a schematic cross-sectional view of the photovoltaic device of FIG. 10G after formation of a protective film over the IMOD mask.

With reference to FIG. 10H, the PV device 1000H can comprise additional layers, such as overlying hard coats, antireflection coatings or passivation layers, without detracting from the masking function of the IMOD mask. For example, a dielectric layer 1080 overlying the IMOD mask 300 can comprise $SiO_2$ or silicon nitride and can serve as a top passivation layer for the PV device. Furthermore, the dielectric layer 1080 can be provided in a thickness suitable to serve as an antireflective (AR) layer which can further enhance the black state of the front electrode regions. Typical thicknesses for AR layers of silicon oxide or nitride are between about 300 Å and 1500 Å. To the extent other layers are positioned between the viewer and the front electrode reflector 303, adjustments may be called for in the choice of materials, optical properties, and thicknesses of the various layers to ensure that the interferometric mask 300 produces the desired reflectivity.

Figure 11A:
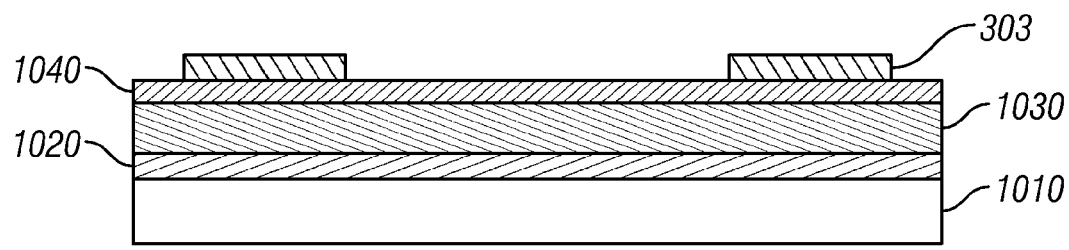
FIGS. 11A-D are schematic cross-sectional views illustrating steps of adding an IMOD mask over a photovoltaic device in accordance with another embodiment, wherein at least one layer defining a optical resonant cavity for the IMOD mask remains unpatterned.

FIGS. 11A-11D illustrate another embodiment in which an IMOD black mask is formed after patterning the front electrodes. FIG. 11A illustrates the PV device structure of FIG. 10D after the conductor layer 1050 of FIG. 10D has been patterned, such as by photolithography and etching, to leave patterned front electrodes or reflectors 303. Suitable materials for the front conductor layer 1050 are discussed above with respect to FIG. 10D. Patterning defines patterned conductors or front electrodes, which will also serve as the reflector 303 for the IMOD mask to be formed. The structure of FIG. 11A may represent, for example, a prefabricated photovoltaic (PV) device prior to packaging. Alternatively, in another embodiment, the PV device may be packaged and include, for example, a passivation layer (not shown) over the structure of FIG. 11A prior to conducting the steps of FIGS. 11B-11D. In such an arrangement, the selection of materials and dimensions for the subsequently formed optical resonant cavity and absorber should account for the optical effect of the passivation layer. Put another way, in such an unpictured embodiment, the passivation layer (not shown) can be considered a part of a composite optical resonant cavity being formed.

Figure 11B:
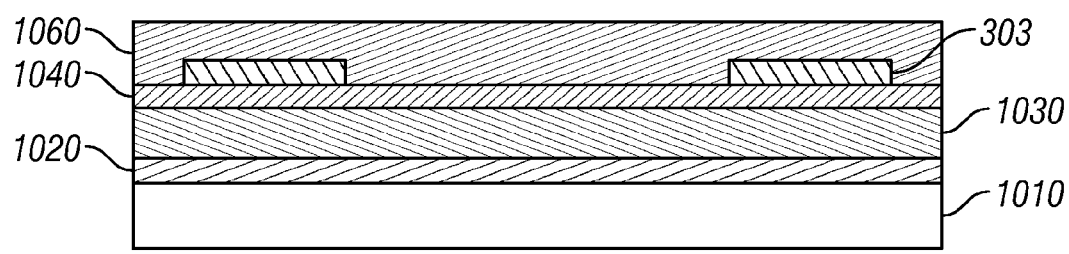

FIG. 11B shows the structure of FIG. 11A after forming a blanket layer or composite structure selected to define the optical resonant cavity layer 1060 for the IMOD mask. As noted in the discussion of FIG. 10E, the optical resonant cavity layer 1060 can be an air gap (see FIG. 3B) defined by spacers, such as posts, pillars or rails; a single transparent conductive or dielectric layer; a composite formed by multiple conductive or dielectric transparent layers; or a composite formed by combination of an air gap with one or more transparent layers.

Figure 11C:
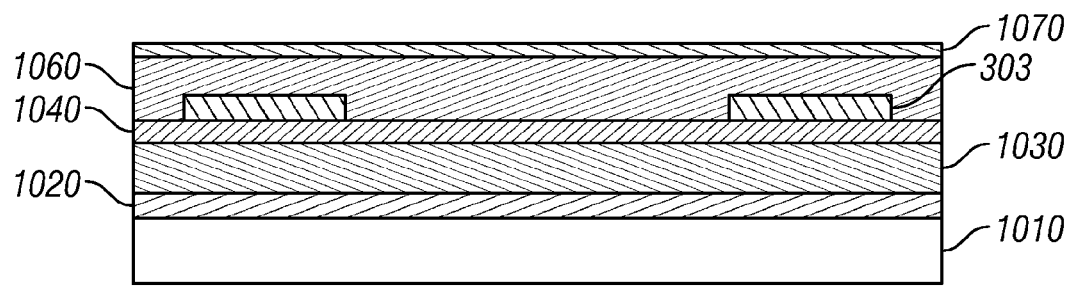

FIG. 11C illustrates the structure of FIG. 11B after deposition of an absorber layer 1070. Suitable materials and thicknesses for the semitransparent absorber layer 1070 are discussed above with respect to FIG. 10F.

Figure 11D:
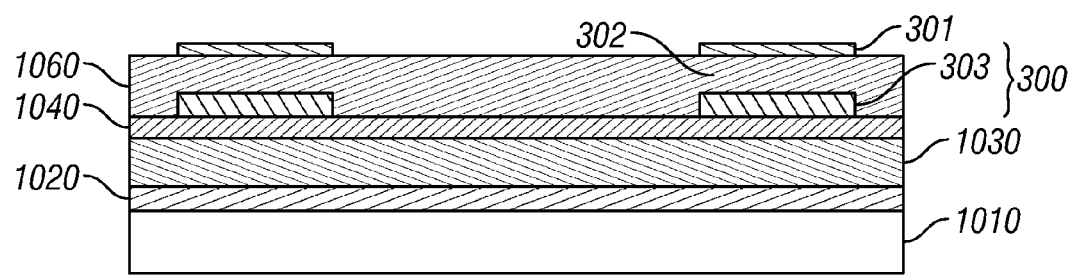

FIG. 11D illustrates the structure of FIG. 11C after patterning the absorber layer 1070 to leave a patterned absorber 301. In the illustrated embodiment, the optical resonant cavity layer 1060 is left as a blanket or unpatterned layer. Hence the optical resonant cavity layer 1060 is blanketed over the PV cell. The absorber 301 is patterned, such as by photolithographic masking and etching, to substantially cover the conductor/electrode 303.

The resultant structure of FIG. 11D is a PV device 1100 that comprises the interferometric or IMOD mask 300, including the patterned reflector 303 that also serves as a front conductor or front electrode for the PV device, a blanket optical resonant cavity layer 1060, and a patterned absorber 301. The blanket optical resonant cavity layer 1060, which can represent a single layer or a composite structure as discussed above, can also serve other functions across the regions where PV active layer 1030 is visible or exposed, such as passivation or antireflection for the PV active layer 1030 or for an optional intervening TCO layer 1040. The regions of the optical resonant cavity layer 1060 that lie between patterned reflector 303 and absorber 301 form the optical resonant cavity 302 for the IMOD mask 300. In the illustrated embodiment, the absorber 301 is patterned to be substantially aligned with the reflector 303.

Figure 12:
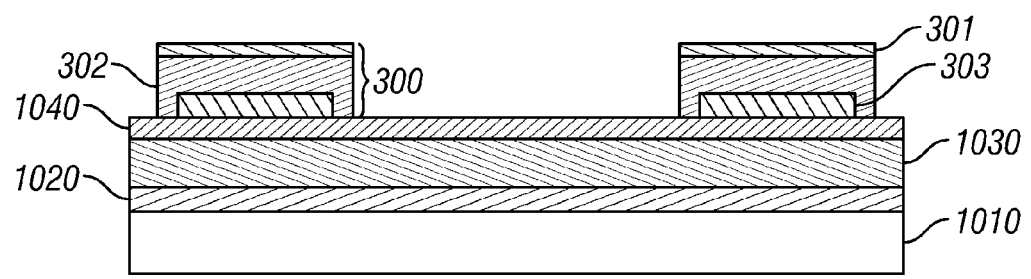
FIG. 12 is a schematic cross-sectional view of a photovoltaic device with an IMOD mask covering electrodes in accordance with another embodiment, wherein the IMOD mask comprises layers that are patterned to be slightly wider than the photovoltaic device front electrodes.

FIG. 12 shows another embodiment of the invention, in which the optical resonant cavity layer 1060 and the absorber layer 1070 (see FIG. 11C), overlying the layers of a PV device as discussed with respect to FIG. 11C, are patterned together to cover the patterned reflectors 303 yielding a PV device 1200 as shown in FIG. 12. In this embodiment, the absorber 301 and the optical resonant cavity 302 are both patterned to cover the electrode, but extend slightly beyond the electrode 303. In such an embodiment, the patterned absorber 301 could extend laterally beyond the edge of the electrode by less than 10% of the width of the electrode on each side, and in one embodiment by less than 5% of the electrode width and the length of the absorber 301 (not pictured) could independently be aligned with or longer (by less than 10% or less than 5%) than the electrode length. The wider absorber 301 better ensures covering to mask reflections from the front conductor/reflector 303, and accommodates reasonable levels of mask misalignment between the reflector 303 pattern and the absorber 301 pattern. On the other hand, by minimizing the extent that the absorber 301 is wider than the reflector 303 that is being interferometrically masked, the amount of light reaching the PV active layer 1030, and thus overall PV device efficiency, can remain high.

In other embodiments not illustrated, the absorber layer and optical resonant cavity structure can extend over all of the PV device, but in that case the absorber layer should be very thin (mostly transmissive) in order to minimize the reduction of light reaching the PV active layer. Thus, the extent of the dark or "black" effect is somewhat sacrificed when thinning a blanket absorber layer to maximize transmission. In that case it may also be desirable to employ an additional semitransparent reflector, with relatively high transmission, over the PV active layer in order to better match the reflected color with that of the IMOD in the front electrode regions.

As discussed with respect to FIG. 10H, the interferometric masks 300 of FIGS. 11D and 12 can also be protected or passivated by further layer(s) formed or deposited over the surface of the embodiments.

Figure 13A:
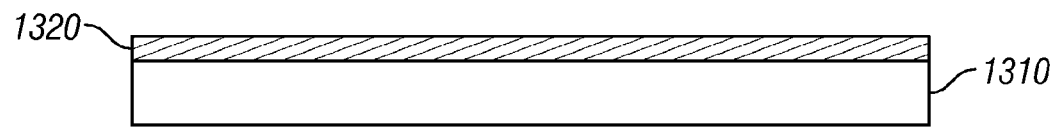
FIGS. 13A-13E are schematic cross-sectional views illustrating steps in a process of manufacturing a thin film photovoltaic device on a transparent substrate, with an integrated IMOD mask.

FIGS. 13A-13E depict a process for manufacturing another embodiment, wherein layers of the PV device are formed over a transparent substrate through which light is transmitted into the PV active region. FIG. 13A begins with an appropriate optically transparent substrate 1310, such as glass, plastic, or other appropriate substrate with useful optical properties. An absorber layer 1320 is formed or deposited on the back side of the substrate, opposite the light-incident or front side. Hence, in FIGS. 13A-13E, light is incident from below. Suitable materials and thicknesses for the semitransparent absorber layer 1320 are discussed above with respect to the absorber layer 1070 of FIG. 10F.

Figure 13B:
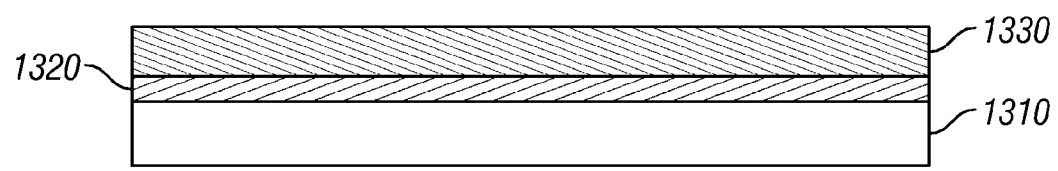

FIG. 13B illustrates the structure of FIG. 13A after forming or depositing an optical resonant cavity layer 1330 over the absorber layer 1320. As noted in the discussion of FIG. 10E, the optical resonant cavity layer 1330 can be an air gap (see FIG. 3B) defined by spacers, such as posts, pillars or rails; a single transparent conductive or dielectric layer; a composite formed by multiple conductive or dielectric transparent layers; or a composite formed by combination of an air gap with one or more transparent layers.

Figure 13C:
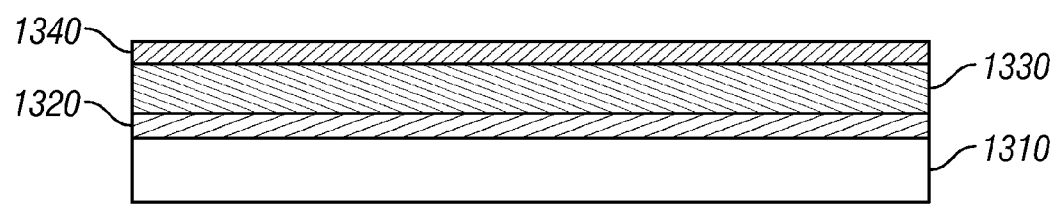

FIG. 13C illustrates further formation or deposition of a conductor layer 1340 over the optical resonant cavity layer 1330. Suitable materials for the conductor layer 1340 are discussed above with respect to the conductor layer 1050 of FIG. 10D.

Figure 13D:
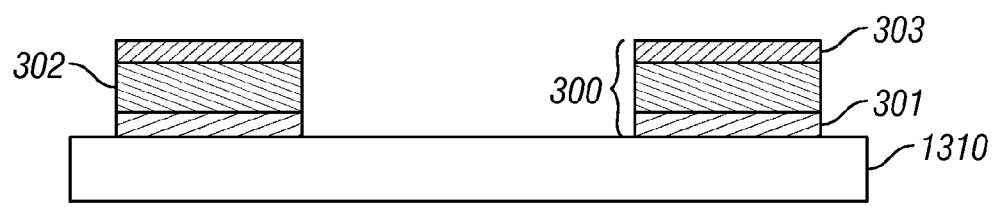

With reference to FIG. 13D, patterning or etching the layers 1320, 1330, 1340 forms an IMOD mask 300 pattern that is substantially similar to or covers the reflector 303 pattern. Patterning the layer stack defines patterned conductors or front electrodes, which will also serve as the reflector 303 for the IMOD mask 300. Although formed on the back side of the substrate, the reflector 303 is still frontward (closer to the light incident side) relative to the PV active layer, which has yet to be formed, and so the reflector 303 is said to define "front conductors" for the PV device.

Figure 13E:
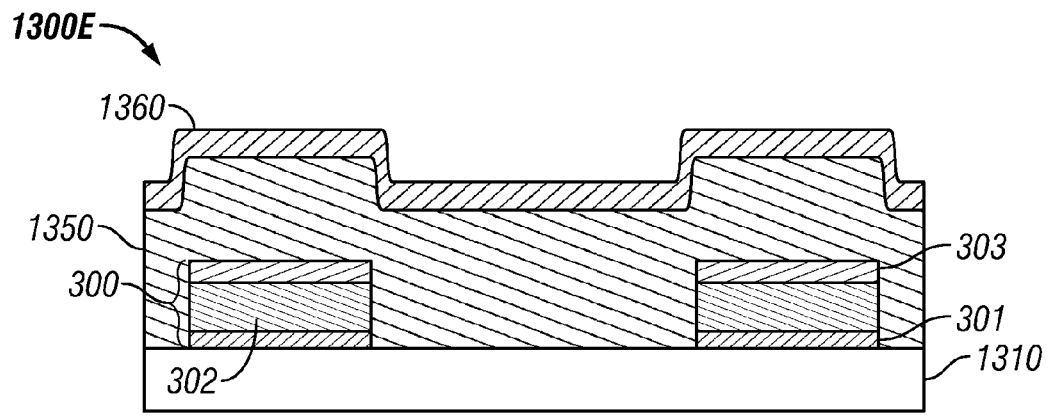

FIG. 13E illustrates the result of depositing a thin film photovoltaic (PV) active layer 1350 behind or opposite a light-incident side of the interferometric mask 300, followed by deposition of a back conductor layer 1360. Suitable materials for thin film PV active layers are discussed above with respect to FIG. 10B, and in general PV active materials include numerous types of photosensitive semiconducting material, such as amorphous silicon. While not shown, a transparent conductor layer (TCO) such as ITO can be deposited prior to depositing the PV active layer 1350 in order to improve electrical contact between the PV active layer 1350 and the front conductors 303 and thus improve collection efficiency of the PV device 1300E. The back conductor layer 1360 may comprise a metal conducting layer, and is typically formed to an opaque thickness.

In the embodiment of FIGS. 13A-13E, the interferometric mask 300 for a PV device is formed on the optical substrate prior to forming or depositing the PV active material 1350. In this embodiment, the photovoltaic device and the interferometric mask 300 are formed on a side of the optical substrate that is opposite the light-incident or front side of the substrate. Accordingly the sequence of layer formation can be opposite that of FIGS. 10A-10G. Additional layers (not shown) can include TCO between the PV active layer 1350 and the substrate 1310, and AR coatings or hard coats on the front side of the substrate 1310.

Figure 13F:
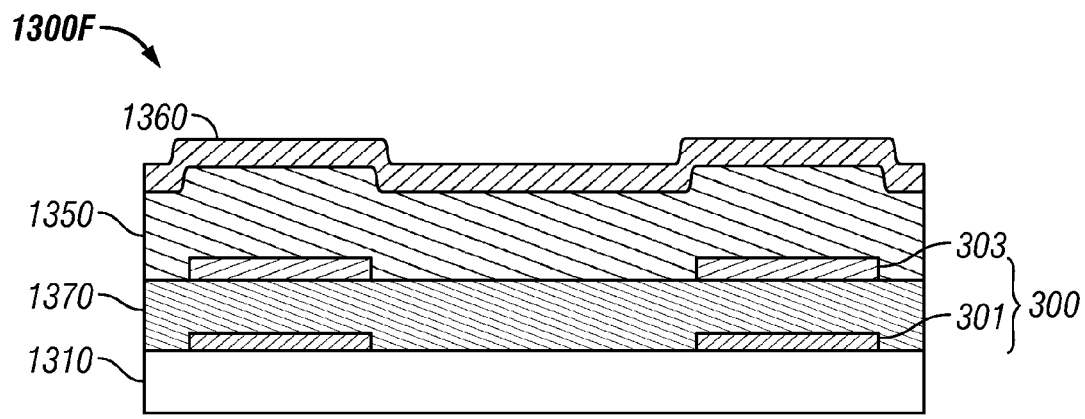
FIG. 13F is a schematic cross-sectional view of another embodiment of an IMOD mask integrated with a thin film photovoltaic device on a transparent substrate, wherein at least one layer defining a optical resonant cavity for the IMOD mask remains unpatterned.

FIG. 13F illustrates another embodiment. FIG. 13F shows the absorber layer 1320 of FIG. 13A being patterned prior to the formation of an optical resonant cavity layer 1370, leaving a patterned absorber 301. Then the optical resonant cavity layer 1370 is deposited or formed over the patterned absorber 301. As noted in the discussion of FIG. 10E, the optical resonant cavity layer 1370 can be an air gap (see FIG. 3B) defined by spacers, such as posts, pillars or rails; a single transparent conductive or dielectric layer; a composite formed by multiple conductive or dielectric transparent layers; or a composite formed by combination of an air gap with one or more transparent layers. A layer of conductor material is deposited over the optical resonant cavity layer 1370. The conductor layer may then be patterned to form the front electrodes for the PV device 1300F, also serving as the patterned reflector 303 for the IMOD mask 300, while leaving the optical resonant cavity layer 1370 unpatterned over the PV cell. Subsequently the PV active layer 1350 is formed over the IMOD mask 300 (including the front electrodes) and the back electrode 1360 is formed over the PV active layer 1350.

Use of a blanket optical resonant cavity layer 1370 in an embodiment where light is transmitted through the substrate, as shown in FIG. 13F, can have several advantages. As mentioned above, a transparent conductive oxide (TCO) is often used to improve contact between an electrode and a photovoltaic material. In the embodiment of FIG. 13F, the optical resonant cavity structure can include or be formed by a TCO layer in contact with the front electrodes formed by the reflector 303. As apparent from a comparison between FIG. 13E and FIG. 13F, the use of a blanket optical cavity layer 1370 also reduces the profile or topography of the device, and thus make subsequent depositions (e.g., of the thin film PV active layer 1350) easier.

Figure 13G:
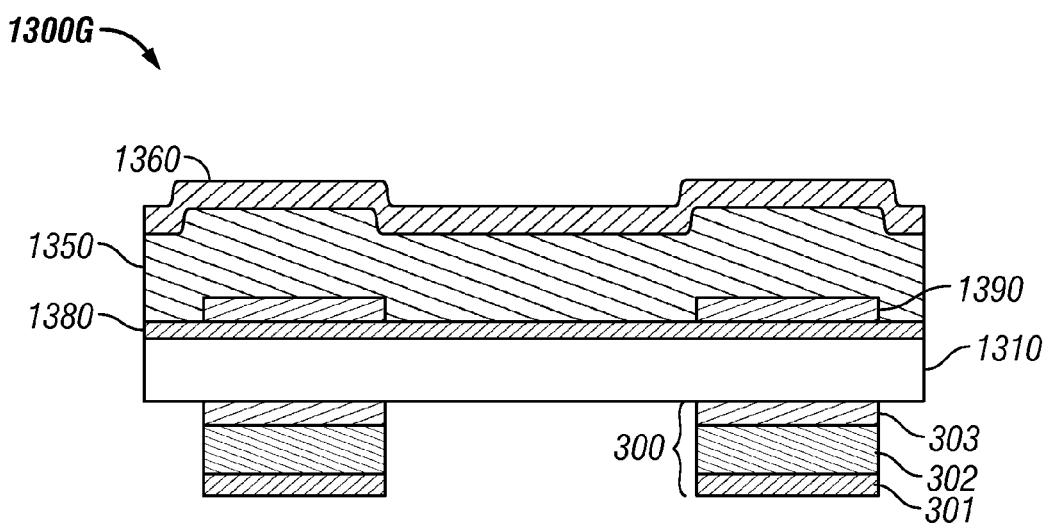
FIG. 13G is a schematic cross-sectional view of another embodiment of an IMOD mask integrated on a front side of a transparent substrate, opposite the side of the substrate with active photovoltaic material.

FIG. 13G illustrates another embodiment in which the interferometric mask 300 is formed on the light-incident or front side of the transparent substrate 1310, while the front electrodes 1390 and the photovoltaic (PV) active layer 1350 are on the back side of the substrate 1310, opposite the light-incident or front side. In such an embodiment, due to the thickness of the substrate 1310 between the reflective front electrode 1390 and the absorber 301, it is desirable for the front side IMOD mask 300 to include a separate reflector 303 on the front side of the substrate 1310, patterned to cover the reflective front electrode 1390 that is on the other side of the substrate 1310. In this case, the PV device 1300G can have a conventional construction on the back side of the substrate 1310, including patterned front electrodes 1390, TCO layer 1380, PV active layer 1350 and back electrode 1360 formed in sequence over the back surface of the transparent substrate 1310. The front side of the substrate 1310 includes an IMOD mask 300 stack of a separate reflector 303, optical resonant cavity 302 and absorber 301, in sequence, formed on the front side of the light-transmissive substrate 1310. As with the illustrated embodiments, this IMOD stack would preferably be patterned to cover the patterned front conductor 1390. Because it has its own reflector 303 and absorber 301, such an IMOD mask is electrically separated from the PV active layer 1350 and can accordingly be separately interconnected to form an electrostatic MEMS IMOD. In such an embodiment, the IMOD mask 300 would be capable of opening and closing, as illustrated in FIGS. 3C and 3D. In this case the optical resonant cavity 302 may include an air gap (340 in FIG. 3C) through which the movable electrode (303 in FIGS. 3C and 3D) can move. As will be appreciated by the skilled artisan, in such an embodiment, dielectric layers and other layers, as well as support posts for spacing the movable electrode/reflector from the stationary electrode/absorber, may be formed in front of the substrate 1310 to implement a movable IMOD mask 300 on the light-incident side of substrate 1310.

Figure 14A:
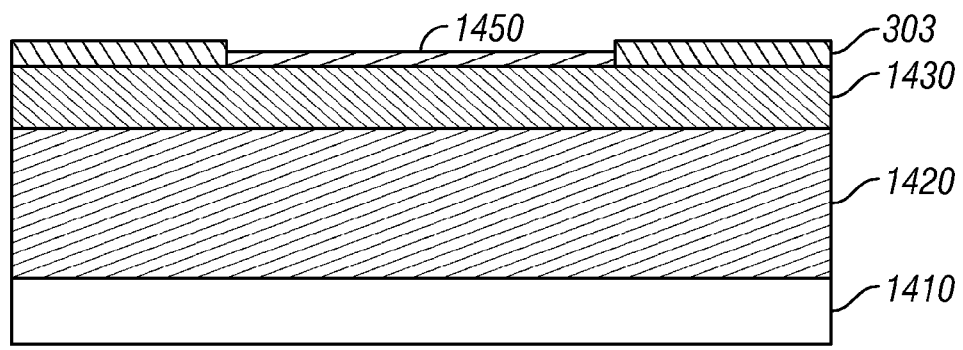
FIGS. 14A and 14B are schematic cross-sectional views of a photovoltaic device formed with a single crystal semiconductor photovoltaic device, with and without an IMOD mask formed over the front electrodes.
Figure 14B:
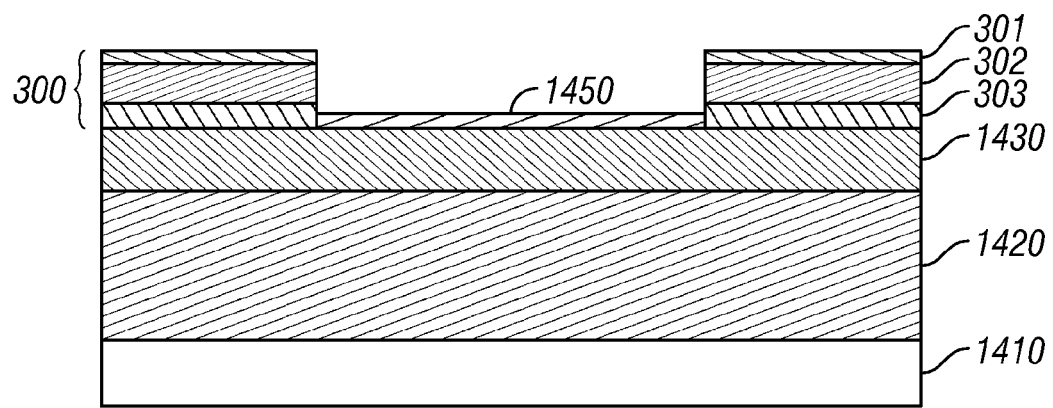

FIGS. 14A-14B illustrate an embodiment of integrating an IMOD mask with a PV device 1400A in which photovoltaic material is a portion of a single crystal semiconductor substrate and/or epitaxial layer(s) formed over such a single crystal substrate. FIG. 14A depicts a photovoltaic (PV) device 1400B comprising a back electrode 1410, a p-type silicon layer 1420, an n-type silicon layer 1430, front conductors or electrodes 303, and an anti-reflective coating 1450. As mentioned previously, it is desirable that the front electrodes 303 (which can be, e.g., bus lines or grid lines for a PV array) be masked, or that reflections from them be reduced or minimized. Hence, an interferometric mask 300 may be formed on a light-incident or front side of the electrodes as shown in FIG. 14B. This can be accomplished in ways similar to those described above, using similar materials. In one embodiment, the process may begin with a silicon substrate or a single crystal silicon material comprising an active region with conductors 303 already patterned, as in FIG. 14A, and the IMOD mask 300 is formed thereover. In another embodiment, the process may begin with a silicon substrate or single crystal silicon material comprising an active region without a front conductor or electrode pattern, and the front conductors are formed as reflectors 303 along with the optical resonant cavity 302 and absorber 301 using techniques similar to those discussed above with respect to FIGS. 10A-10G and 11A-11D. As noted previously, the absorber 301 and the optical resonant cavity 302, or the absorber alone, may be patterned to be substantially aligned with the front electrode/reflector 303 so as to cover the reflector 303 as shown in FIG. 14B. In another embodiment, the absorber 301 and the optical resonant cavity 302, or the absorber alone, may be patterned so as to follow the pattern of the front electrode/reflector 303 but be wider to cover a greater surface area than the reflector 303. As in FIGS. 11D and 13F, the optical resonant cavity layer may be left unpatterned or blanketed over the PV cell, while the front electrode/reflector 303 and absorber 301 are patterned. In yet another embodiment, the absorber 301, the optical resonant cavity 302, and/or the front electrode/reflector 303 can be screen printed, in which case formation and patterning are conducted simultaneously. The layers that form the front electrode/reflector, optical resonant cavity and absorber can be screen printed together in any grouping or separately. Furthermore some layer(s) can be patterned by lithography and etch, while other layer(s) can be screen printed.

The foregoing embodiments teach IMOD mask constructions that can be employed to interferometrically mask front electrodes of PV devices that have a wide variety of constructions. For example, in addition to the thin film and crystalline silicon PV cells and the transmissive substrate embodiments discussed above, an interferometric or IMOD mask may be used to mask reflections from the front electrodes of a thin film interferometrically enhanced photovoltaic cell or device.

Figure 15:
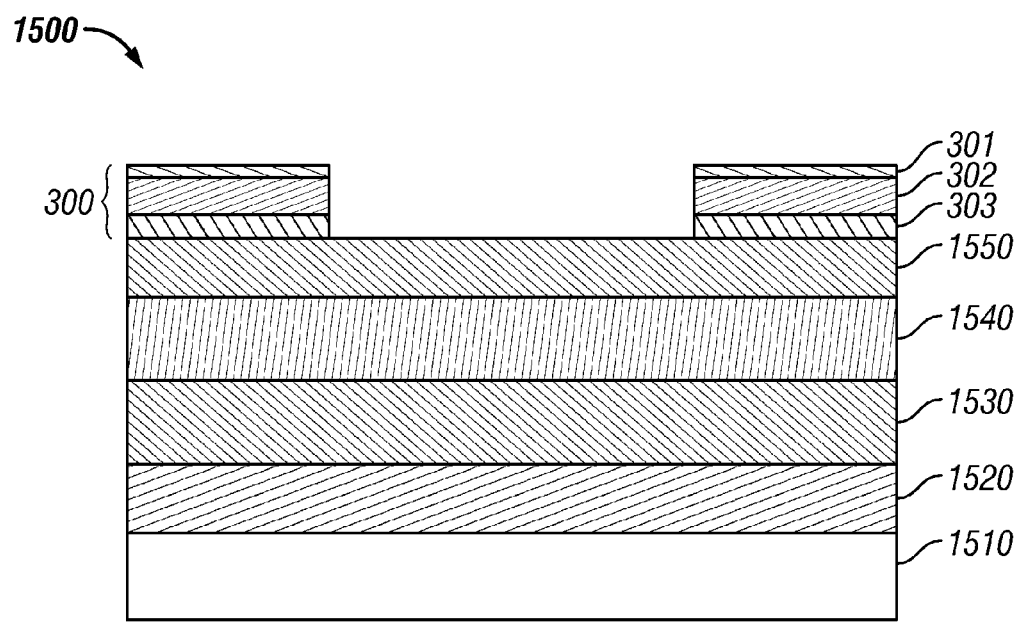
FIG. 15 is a schematic cross-sectional view of an embodiment of an interferometrically-enhanced photovoltaic device with an integrated IMOD mask.

FIG. 15 illustrates an embodiment of a PV device 1500 where an interferometric mask 300 masks reflections from a reflector 303 which may serve as a front conductor or electrode of an interferometrically enhanced cell formed on a suitable substrate 1510. In the illustrated embodiment, the conductor 303 is in electrical contact with a PV active layer 1540 through a TCO layer 1550. In other embodiments, the conductor 303 is directly in electrical contact with the active layer 1540, or is in electrical contact through other layers and materials not shown. The illustrated interferometrically tuned photovoltaic cells comprises a reflector 1520 and an optical resonant cavity 1530 disposed behind, or opposite a light-incident side, of the PV active layer 1540. The PV active layer 1540 may comprise a thin film photovoltaic material, such as amorphous silicon, CIGS or other thin semiconductor film photovoltaic material. The optical properties (dimensions and material properties) of the reflector 1520 and optical resonant cavity 1530 are selected so that reflection from interfaces of the layered PV device 1500 coherently sum to produce an increased field in the PV active layer 1540 of the photovoltaic cell, where optical energy is converted into electrical energy. Such interferometrically enhanced photovoltaic devices increase the absorption of optical energy in the active region of the interferometric photovoltaic cell and thereby increase the efficiency of the device 1500. In variations on this embodiment, multiple optical resonant cavities can be employed to separately tune different wavelengths of light and maximize absorption in the PV active layer(s). The buried optical resonant cavity 1530 may comprise transparent conductive or dielectric materials, air gaps, or combinations thereof.

Figure 16:
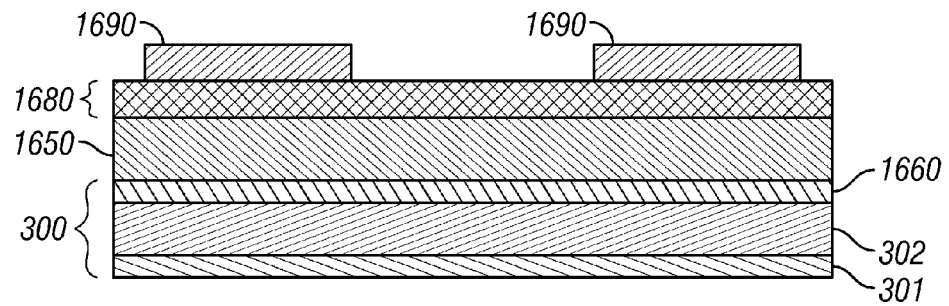
FIG. 16 is a schematic cross-sectional view of an embodiment of an interferometrically-enhanced photovoltaic device in which an integrated IMOD mask is operatively coupled to the back electrode.

With reference to FIG. 16, in applications where the back side of the photovoltaic device may be visible, such as for window applications, the interferometric mask 300 may be integrated with or formed on the back side of the photovoltaic active layer 1350, and more particularly over the back side of the back electrode 1660 (see FIG. 16). As with the front electrode 1690, the back electrode 1660 tends to be reflective and unseemly when visible. In some embodiments, the IMOD mask 300 is configured such that the color of light reflected from the mask substantially matches a color of the surrounding features on the back side of the photovoltaic device. In some embodiments, the IMOD mask 300 is configured such that the color of light reflected from the mask substantially matches a color in the visible spectrum. In some embodiments, the light reflected from the IMOD mask 300 falls within the wavelengths associated with the visible spectrum. In some embodiments, the IMOD mask 300 is configured such that little or no incident visible light is reflected from the back side of the IMOD mask 300 such that the IMOD mask appears black from a normal viewing angle. The IMOD mask 300 therefore can greatly reduce the reflectivity from the back electrodes (normally 30-90%) to less than 10% or less than 5%. If a black appearance is desired, reflectivity can be about 1-3%.

In some embodiments, the back side interferometric mask 300 may be patterned across the wafer or across the cell to cover any pattern in the back electrode 1660. From the standpoint of PV functionality, such patterning may not be needed, since the light to be converted comes through the front side and the back side can be opaque, such that the back side interferometric mask may blanket or cover the entire back side of the wafer. However, for applications where the backside is visible, often parts of the window or solar panel are translucent, transparent, or semi-transparent. In that case, patterning the IMOD mask 300 to follow a pattern of the back electrode 1660 can help maintain transparency in regions adjacent to the back electrode 1660, thereby allowing some light through. As discussed above with respect to the front electrodes, such IMOD mask patterns may be aligned with the back electrode patterns or maybe cover and extend beyond the surface of the back electrode by less than 10% or less than 5%. Also, similar to front side IMOD masks, the optical resonant cavity 302 of the back side mask 300 can be formed with optically transparent films, including conductive or dielectric layers, an air gap, multiple layers, or combinations of layer(s) and an air gap.

With reference to FIGS. 17A-20, an interferometric modulator (IMOD) mask can mask high reflectivity of a conductive ribbon or tab. The ribbon connects electrodes or buses across multiple photovoltaic (PV) devices, cells or wafers to form large solar panels, which greatly increases the amount of electrical charge that can be converted into direct current. The introduction of an IMOD mask over the conductive ribbon masks or blends the appearance of the reflective ribbon with the surrounding photovoltaic device, making the device more attractive to the consumer. For the typical PV device, the IMOD mask reduces reflections from ribbons on the front or back side of the PV device to darken the bright reflections from the ribbon. In some embodiments, the IMOD mask is configured such that the color of light reflected from the mask substantially matches a color of the surrounding features on the photovoltaic device. In some embodiments, the IMOD mask is configured such that the color of light reflected from the mask substantially matches a color in the visible spectrum. In some embodiments, the light reflected from the IMOD mask falls within the wavelengths associated with the visible spectrum. In some embodiments, the IMOD mask is configured such that little or no incident visible light is reflected from the IMOD mask such that the IMOD mask appears black from a normal viewing angle. As discussed above with respect to front electrodes, the IMOD mask preferably exhibits reflectivity in the visible range of less than 10% or even less than 5%. If a black appearance is desired, the IMOD mask can arrange reflectivity in the about 1-3% range. In other arrangements, "masking" may involve interferometrically producing a color in the visible spectrum that blends in with adjacent features on the device. "Color" IMOD masks can reflect a coherent band or bands of wavelengths to appear, e.g., red, green, blue, orange, etc.

Figure 17A:
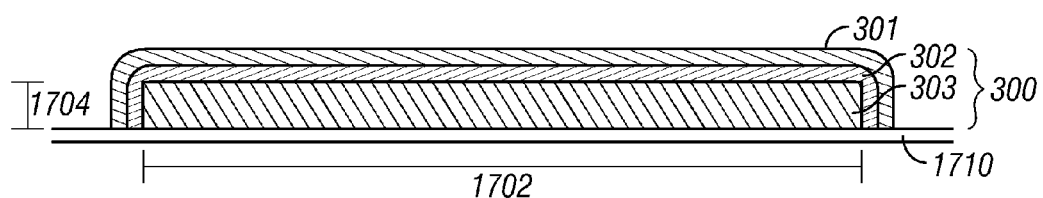
FIG. 17A is a schematic cross-sectional view of an embodiment of a conductive ribbon with an integrated IMOD mask on one side.

With reference to FIG. 17A, in one embodiment, the conductive ribbon is integrated with the interferometric mask stack on one side of the ribbon. The illustrated conductive ribbon comprises an elongated conductor layer 303, an optical resonant cavity 302, and an absorber layer 301. In some embodiments, a separate metallic reflector or mirror layer (not shown) is deposited on the conductor layer 303 before the deposition of the optical resonant cavity 302 and the absorber layer 301. The mirror layer may be formed from Al or Mo, or other similar materials. In the embodiment shown in FIG. 17A, the conductor layer 303 itself functions as both the reflector for the IMOD mask 300 and the conductive ribbon material carrying the bulk of current between PV cells. The conductor layer is generally dimensioned with a length sufficient to connect a plurality of PV devices, cells or wafers, and a width 1702 and thickness 1704 sufficient to produce high conductivity. Typical thicknesses 1704 are between 0.08 mm and 0.3 mm, while typical widths 1702 are between 1.5 mm and 15 mm. The edges of the conductor layer 303 may be angled or rounded. The conductor layer 303 generally comprises copper, but may be formed with other conductive materials. The optical resonant cavity 302 may be formed of an optically transparent dielectric layer, such as $SiO_2$, or an optically transparent conductive material, such as ITO or ZnO. As previously described for front and back side IMOD masks, the optical resonant cavity 302 may be formed with a single optically transparent layer, using multiple layers, air gap(s) and combinations of the same. The optical resonant cavity 302 is configured in dimension such that it optimizes constructive and/or destructive interference of select wavelengths of light, for example selecting certain wavelengths associated with the visible spectrum for constructive or destructive interference.

One of the two major sides of the conductor layer 303 may be coated or laminated with the optical resonant cavity 302 and absorber layer 301 as shown in FIG. 17A. One way of forming the embodiment of FIG. 17A is to place the ribbon conductor on a support layer 1710, such as tape or another substrate, and coat it with additional materials to form the optical resonant cavity 302 and absorber layer 301 on the exposed surfaces. Another way of coating the optical resonant cavity 302 and absorber layer 301 onto the ribbon conductor 303 is to wind the ribbon conductor from roll to roll while depositing the layers 301, 302 in a sputter tool.

Figure 20:
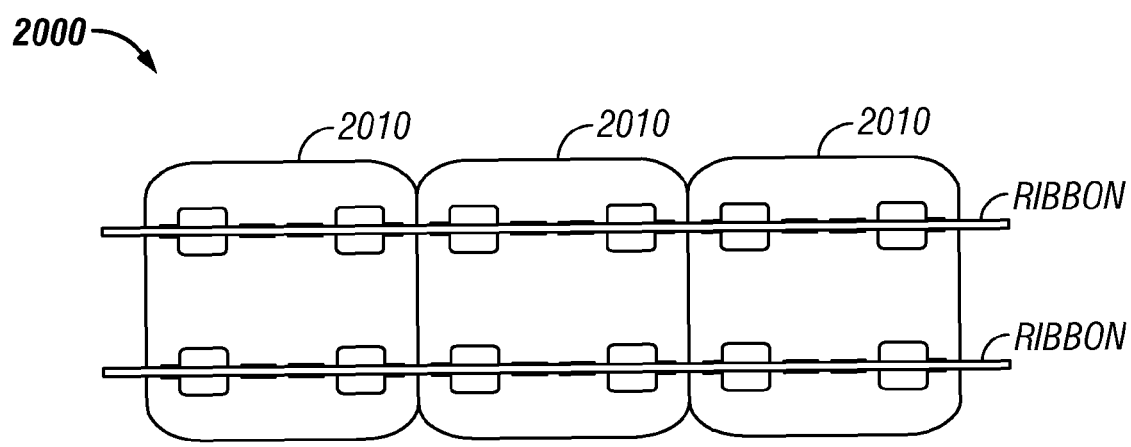
FIG. 20 is a schematic top-down view of a plurality of photovoltaic devices, wafers or cells interconnected by a conductive ribbon.

With reference to FIG. 20, the prefabricated ribbon with the integrated IMOD mask 300 can then be interconnected with the contacts, electrodes, or buses of multiple solar cells 2010 to form a larger solar panel 2000. The wafers are unloaded from a stack and aligned. The photovoltaic ribbon is cut to length and provided with stress-relief bends. While FIG. 20 illustrates photovoltaic ribbon being applied to the back side of the wafers, this process can also be performed on the front side.

Figure 17B:
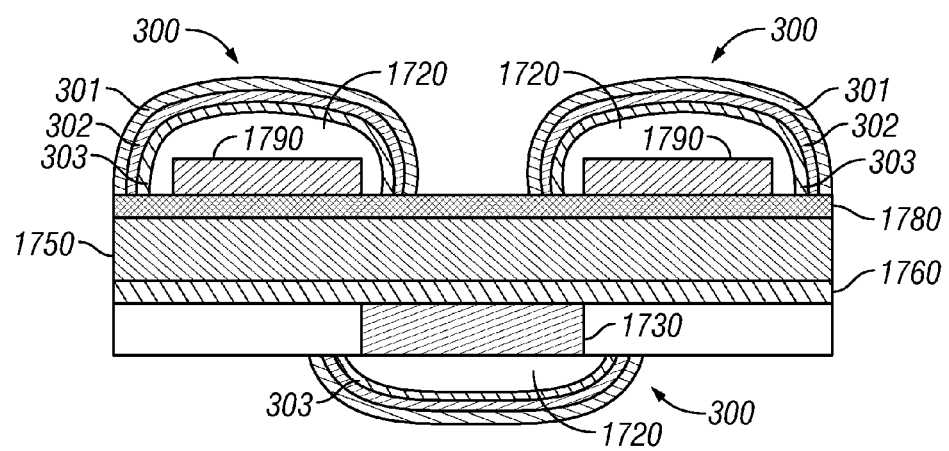
FIG. 17B is a schematic cross-sectional view of a photovoltaic device with masked ribbons, like that of FIG. 17A, attached to electrodes of the photovoltaic device, for interconnection of multiple photovoltaic devices.

FIG. 17B illustrates use of solder 1720, or an adhesive layer of another material, applied to at least a portion of the conductors to be interconnected. The conductor 303 of the integrated IMOD mask 300 is then placed onto the solder 1720, which is disposed on top of the cell contacts 1730 or on the front electrodes 1790, as illustrated in FIG. 17B. While illustrated with the solder 1720 contacting the back electrodes 1760 by way of the cell contacts 1730, it will be understood that solder can also directly contact back electrodes. This method is useful for soldering the ribbon conductor 303 to the front electrodes 1790, back electrodes 1760, and/or on contacts 1730 through insulating material, in a single step or in a plurality of steps. In some embodiments, the IMOD mask 300 may also be conductive, to facilitate electrical contact among the conductive features.

The skilled artisan will appreciate that the structure of FIG. 17B can also be obtained by standard formation of ribbon interconnection of multiple PV devices followed by shadow-masked deposition or deposition and patterning of IMOD mask layers. While solder or other conductive adhesive layers can be omitted by such a process, thin film deposition is in practice difficult on large interconnected solar panels.

Figure 18A:
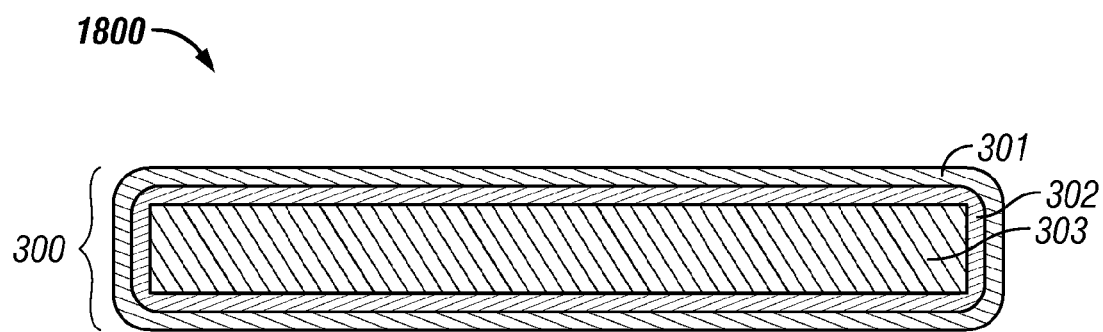
FIG. 18A is a schematic cross-sectional view of another embodiment of a conductive ribbon with an integrated IMOD mask covering both sides of the ribbon conductor.

In another embodiment as illustrated in FIG. 18A, the ribbon conductor 303 is coated with the interferometric mask stack on both sides, for greater manufacturing ease, to form an integrated IMOD-masked ribbon 1800 prior to attaching the ribbon on PV devices. In this embodiment, the optical resonant cavity 302 is preferably formed from a transparent conductive material, such as the transparent conductive oxides (TCOs), e.g., ITO or ZnO. The absorber layer 301 is also preferably formed from a conductive material, such as semitransparent thicknesses of Mo, Cr, MoCr, or Ti, in order to facilitate an electrical contact between the conductors for the PV device and the ribbon conductor 303 (which in the illustrated embodiment also serves as the reflector for the IMOD mask 300). Accordingly, the coated ribbon 1800 can be readily soldered or otherwise electrically and mechanically connected to conductors of the PV device. As noted with respect to FIG. 17A, the IMOD mask 300 of the surrounded ribbon embodiment can also include a separate reflective mirror layer between the ribbon conductor 303 and the optical resonant cavity 302.

Figure 18B:
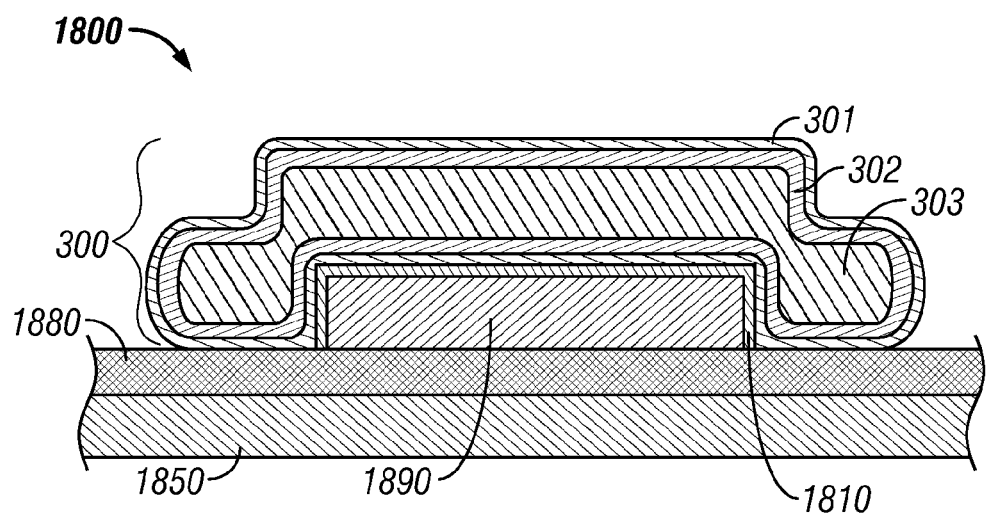
FIG. 18B is a schematic cross-sectional view of a photovoltaic device with masked ribbons, like that of FIG. 18A, attached to electrodes of the photovoltaic device, for interconnection of multiple photovoltaic devices.

FIG. 18B illustrates a close-up view of one method of attaching the integrated IMOD-masked ribbon 1800 with the photovoltaic device. In this embodiment, an integrated IMOD-masked ribbon 1800, with an optical resonant cavity 302 and an absorber layer 301 coated on both sides of the ribbon conductor 303, is applied to a front electrode 1890 of a PV device and attached by means of an adhesive layer 1810. In the illustrated embodiment, the front electrode 1890 electrically communicates with the PV active layer 1850 by way of a TCO layer 1880. This method is similar to the soldering method shown in FIG. 17B, except that the ribbon conductor 303 comes pre-fabricated with the integrated IMOD mask 300.

Figure 19:
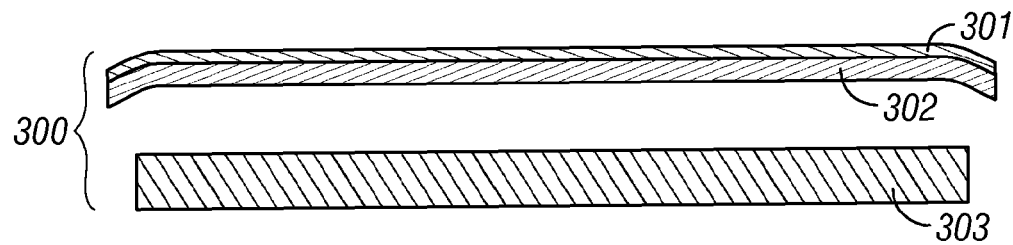
FIG. 19 is a schematic cross-sectional view of an embodiment of an interferometrically-enhanced photovoltaic ribbon in which the ribbon conductor and the photovoltaic layers are manufactured separately for integration on a photovoltaic device.

In another embodiment as illustrated in FIG. 19, the IMOD mask layers (the optical resonant cavity 302 and the absorber layer 301) and the ribbon conductor 303 are prefabricated but provided separately. For example, the layers forming the optical resonant cavity 302 and absorber layer 301 are formed on a tape or other substrate (not shown), optionally with a release layer (not shown). In this embodiment, the conductor ribbon 303 and photovoltaic layers can be integrated on the PV device(s), either at the time of ribbon tabbing or soldering, or subsequently. With references to FIGS. 17B and 19, according to one possible sequence, first solder 1720 is placed on the front and back electrodes of the PV device that are to be interconnected. Next, the ribbon conductor 303 is aligned with the aforementioned cell contacts 1730, front electrodes 1790 and/or back electrodes 1760 and soldered or tabbed in place. Next, the IMOD mask layers (the optical resonant cavity 302 and the absorber layer 301) are either coated or laminated onto the ribbon conductor 303.

While the foregoing detailed description discloses several embodiments of the present invention, it should be understood that this disclosure is illustrative only and is not limiting of the present invention. It should be appreciated that the specific configurations and operations disclosed can differ from those described above, and that the methods described herein can be used in contexts other than fabrication of semiconductor devices.

We claim:

1. A method of interconnecting a plurality of photovoltaic cells, comprising:
   aligning a ribbon conductor along a plurality of photovoltaic cells, wherein the ribbon conductor includes a conductive layer, an optical resonant cavity over the conductive layer, and an absorber layer over the optical resonant cavity, wherein the absorber layer includes a semitransparent thickness of a metallic or semiconductor layer, and wherein the optical resonant cavity and the absorber layers are configured to reduce a percentage of reflectivity of the conductive layer to less than about 10 percent; and
   attaching the ribbon conductor along the plurality of photovoltaic cells such that the ribbon conductor is operatively coupled to the photovoltaic cells and the photovoltaic cells are electrically interconnected.

2. The method of claim 1, further including providing the ribbon conductor with stress-relief bends.

3. The method of claim 1, wherein attaching the ribbon conductor includes using an adhesive layer.

4. The method of claim 3, wherein the adhesive layer includes solder.

5. The method of claim 1, wherein the photovoltaic cells have a plurality of at least one of front electrodes, back electrodes, and contacts.

6. The method of claim 5, wherein the ribbon conductor connects the plurality of at least one of the front electrodes, back electrodes, and contacts through insulating material.

7. The method of claim 1, wherein the optical resonant cavity layer and the absorber layer are made of a conductive material.

8. The method of claim 1, wherein the optical resonant cavity layer and the absorber layer are configured such that a color of light reflected from the conductor substantially matches a color of surrounding features on the photovoltaic device.

9. The method of claim 1, wherein the optical resonant cavity layer and the absorber layer are configured such that little or no incident visible light is reflected from the conductor such that the ribbon appears black from a normal viewing angle.

10. The method of claim 1, wherein the optical resonant cavity layer and the absorber layer are configured such that the reflectivity in the visible range from the conductor is less than 5%.

11. A system for converting optical energy to electrical energy comprising:
a plurality of photovoltaic cells;
a conductor electrically connecting the plurality of photovoltaic cells;
the conductor including a conductor layer and an optical interferometric modulator mask over the conductor layer,
wherein the mask includes an optical resonant cavity over the conductor layer, and an absorber layer over the optical resonant cavity, wherein the absorber layer includes a semitransparent thickness of a metallic or semiconductor layer; and
wherein the mask is configured to mask reflections from the conductor layer to less than about 10 percent.

12. The system of claim 11, further including an adhesive material configured for joining the conductor layer and optical interferometric modulator mask with the plurality of photovoltaic cells.

13. The system of claim 12, wherein the adhesive material includes solder.

14. The system of claim 11, wherein the optical interferometric modulator mask is configured to appear black.

15. The system of claim 11, wherein the optical interferometric modulator mask is configured to reduce visible reflectivity over the conductor layer to less than 5%.

16. The system of claim 11, wherein the optical interferometric modulator mask further includes a reflective mirror layer between the optical resonant cavity and the conductor layer.

17. The system of claim 11, wherein the optical resonant cavity includes a dielectric layer.

18. The system of claim 11, wherein the optical resonant cavity includes an optically transparent conductive layer.

19. The system of claim 11, wherein the optical resonant cavity includes a plurality of layers.

20. The system of claim 11, wherein the optical resonant cavity is disposed along both a front side and a back side of the conductor layer such that the optical resonant cavity substantially surrounds the conductor layer.

21. The system of claim 11, wherein the metallic material is selected from the group consisting of Cr, Mo, MoCr, and Ti.

* * * * *